(12) United States Patent
Oberski et al.

(10) Patent No.: US 9,819,124 B2
(45) Date of Patent: Nov. 14, 2017

(54) LOW CROSSTALK PRINTED CIRCUIT BOARD BASED COMMUNICATIONS PLUGS AND PATCH CORDS INCLUDING SUCH PLUGS

(71) Applicant: CommScope, Inc. of North Carolina, Hickory, NC (US)

(72) Inventors: Jeffrey A. Oberski, Lucas, TX (US); Patrick L. Fariello, Murphy, TX (US)

(73) Assignee: CommScope, Inc. of North Carolina, Hickory, NC (US)

( * ) Notice: Subject to any disclaimer, the term of this patent is extended or adjusted under 35 U.S.C. 154(b) by 0 days.

(21) Appl. No.: 15/213,536

(22) Filed: Jul. 19, 2016

(65) Prior Publication Data

US 2017/0033503 A1 Feb. 2, 2017

Related U.S. Application Data

(60) Provisional application No. 62/198,178, filed on Jul. 29, 2015.

(51) Int. Cl.
*H01R 24/00* (2011.01)
*H01R 13/6469* (2011.01)
(Continued)

(52) U.S. Cl.
CPC ....... *H01R 13/6469* (2013.01); *H01R 12/515* (2013.01); *H01R 13/6466* (2013.01);
(Continued)

(58) Field of Classification Search
CPC .............. H01R 13/6658; H01R 23/025; H01R 13/6616; H01R 23/005
(Continued)

(56) References Cited

U.S. PATENT DOCUMENTS 5,975,936 A * 11/1999 Lin ................. H01R 24/64
439/344
7,150,657 B2 * 12/2006 Quenneville ...... H01R 13/6463
439/418
(Continued)

FOREIGN PATENT DOCUMENTS

KR 10-2004-0045672 A 6/2004

OTHER PUBLICATIONS

Notification of Transmittal of the International Search Report and the Written Opinion of the International Searching Authority, or the Declaration, corresponding to PCT/US2016/042883, dated Jan. 6, 2017, 16 pages.

*Primary Examiner* — Thanh Tam Le
(74) *Attorney, Agent, or Firm* — Myers Bigel, P.A.

(57) ABSTRACT

Patch cords include a cable having eight conductors that are twisted together to form four differential pairs of conductors and a plug that is attached to the cable. The plug includes a housing, a printed circuit board, and respective first through eighth plug contacts that are electrically connected to the respective first through eighth conductors via respective first through eighth conductive paths on the printed circuit board. The plug contacts are arranged in a row in numerical order. The plug includes a wire guide that has a top shelf that extends above the printed circuit board and a bottom shelf that extends below the printed circuit board. Two of the differential pairs are routed into respective first and second channels in the top shelf and the other two of the differential pairs are routed into respective third and fourth channels in the bottom shelf.

18 Claims, 13 Drawing Sheets

(51) Int. Cl.
*H01R 12/51* (2011.01)
*H01R 13/6466* (2011.01)
*H01R 13/6581* (2011.01)
*H01R 13/66* (2006.01)
*H01R 13/6463* (2011.01)
*H01R 24/64* (2011.01)
*H01R 107/00* (2006.01)

(52) U.S. Cl.
CPC ....... *H01R 13/6581* (2013.01); *H01R 13/665* (2013.01); *H01R 13/6463* (2013.01); *H01R 24/64* (2013.01); *H01R 2107/00* (2013.01)

(58) Field of Classification Search
USPC ..... 439/76.1, 344, 418, 620.21–620.23, 676, 439/941
See application file for complete search history.

(56) References Cited

U.S. PATENT DOCUMENTS

| | | | |
|---|---|---|---|
| 7,201,618 B2* | 4/2007 | Ellis | H01R 13/6477 439/676 |
| 7,220,149 B2* | 5/2007 | Pharney | H01R 13/6467 439/676 |
| 7,364,470 B2* | 4/2008 | Hashim | H05K 1/0228 439/676 |
| 7,425,159 B2* | 9/2008 | Lin | H01R 13/6461 439/676 |
| 7,503,810 B1* | 3/2009 | Goodrich | H01R 13/501 439/676 |
| 7,857,635 B2 | 12/2010 | Goodrich et al. | |
| 7,972,183 B1* | 7/2011 | Lin | H01R 13/6463 439/676 |
| 8,197,286 B2 | 6/2012 | Larsen et al. | |
| 8,690,598 B2 | 4/2014 | Bolouri-Saransar et al. | |
| 8,858,267 B2* | 10/2014 | Hashim | H01R 13/6466 439/676 |
| 8,864,532 B2 | 10/2014 | Larsen et al. | |
| 8,894,447 B2* | 11/2014 | Canning | H01R 24/28 439/676 |
| 8,915,756 B2* | 12/2014 | Schumacher | H01R 13/6466 439/676 |
| 8,920,199 B2 | 12/2014 | Schumacher et al. | |
| 2002/0142644 A1 | 10/2002 | Aekins | |
| 2009/0163083 A1 | 6/2009 | Sawatari | |
| 2014/0120779 A1 | 5/2014 | Lloyd et al. | |
| 2014/0273629 A1 | 9/2014 | Canning et al. | |
| 2014/0378004 A1 | 12/2014 | Hashim et al. | |

* cited by examiner

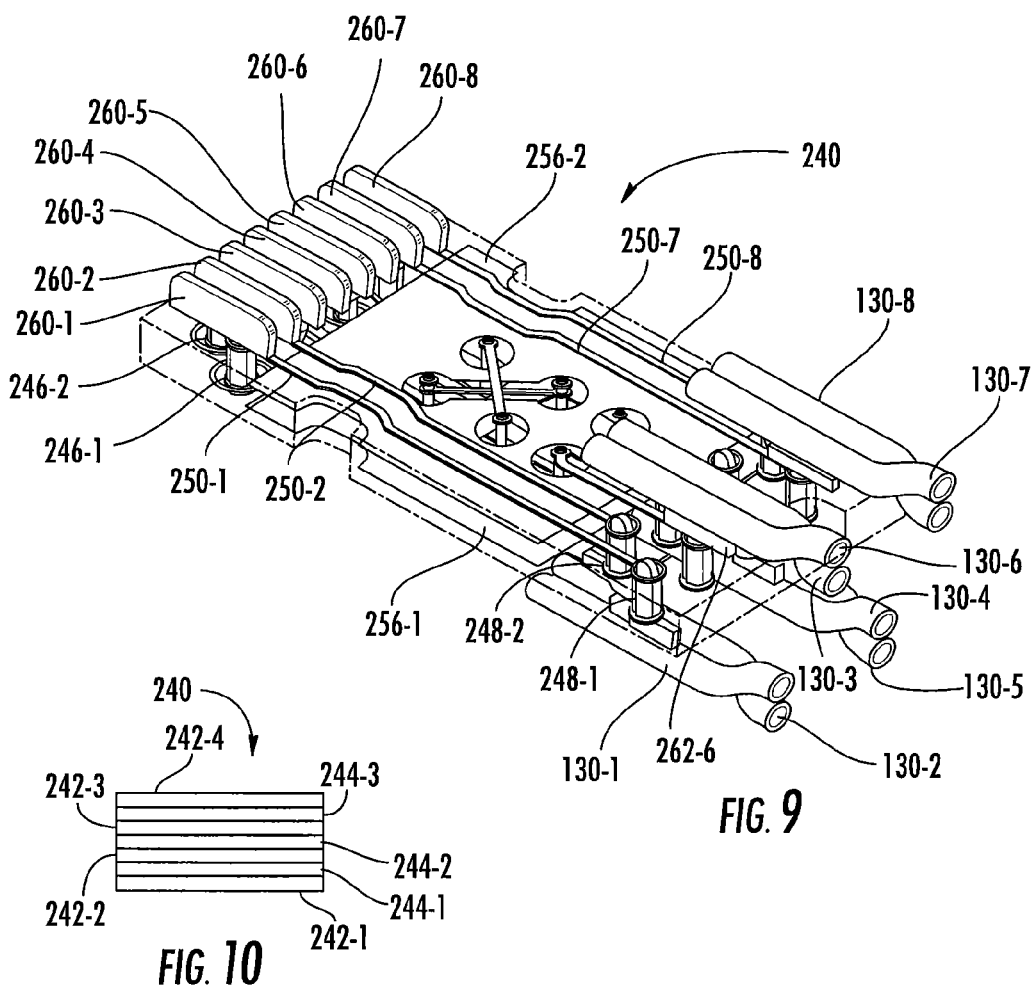
FIG. 9
FIG. 10
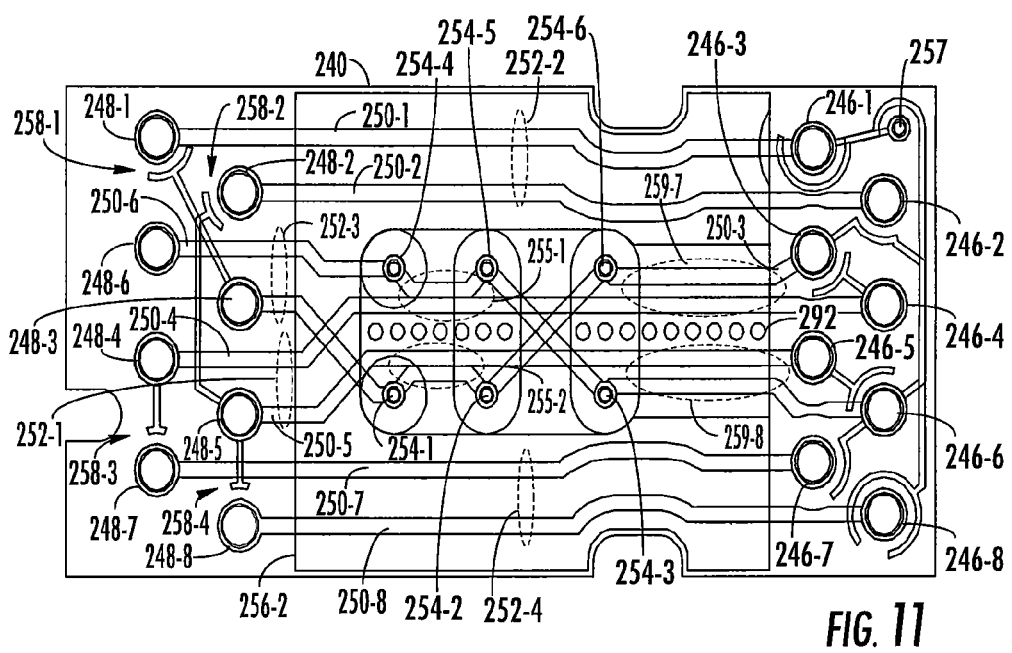
FIG. 11

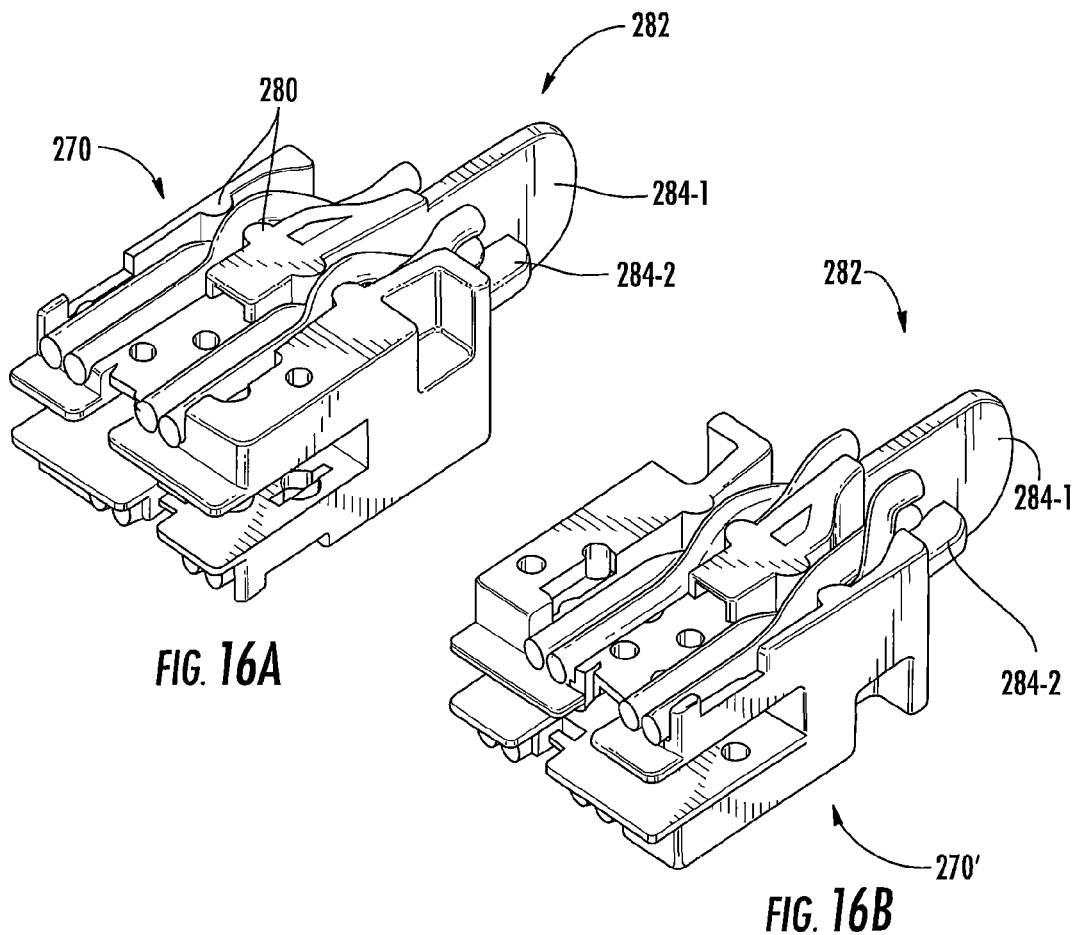
FIG. 16A
FIG. 16B
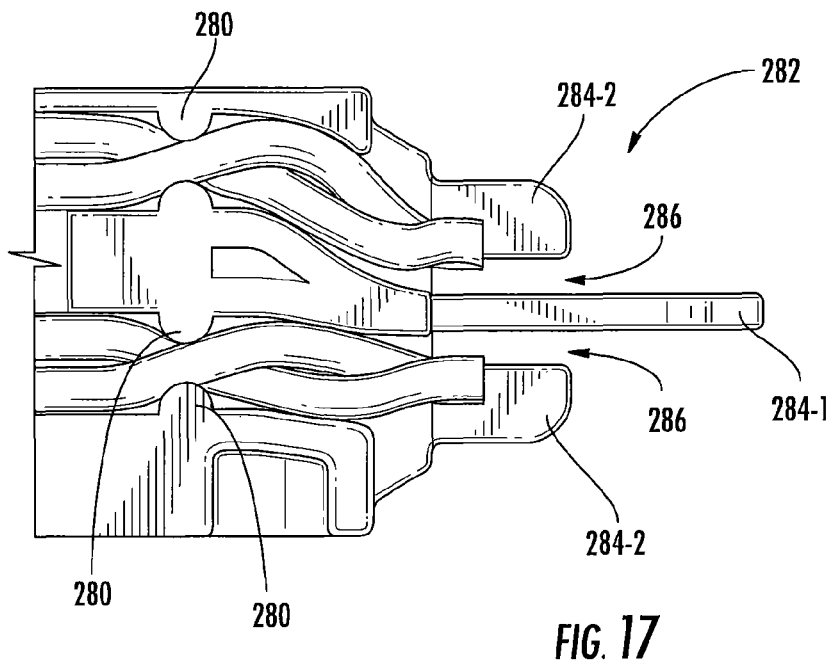
FIG. 17

LOW CROSSTALK PRINTED CIRCUIT BOARD BASED COMMUNICATIONS PLUGS AND PATCH CORDS INCLUDING SUCH PLUGS

CROSS-REFERENCE TO RELATED APPLICATION

The present application claims priority under 35 U.S.C. §119 to U.S. Provisional Patent Application Ser. No. 62/198,178, filed Jul. 29, 2015, the entire content of which is incorporated herein by reference.

FIELD OF THE INVENTION

The present invention relates generally to communications connectors and, more particularly, to communications connectors such as modular plugs that may exhibit improved crosstalk performance.

BACKGROUND

Many hardwired communications systems use plug and jack connectors to connect a communications cable to another communications cable or to computer equipment. By way of example, high speed communications systems routinely use such plug and jack connectors to connect computers, printers and other devices to local area networks and/or to external networks such as the Internet. FIG. 1 depicts a highly simplified example of such a hardwired high speed communications system that illustrates how plug and jack connectors may be used to interconnect a computer 11 to, for example, a network server 20.

As shown in FIG. 1, the computer 11 is connected by a cable 12 to a communications jack 15 that is mounted in a wall plate 19. The cable 12 is a patch cord that includes a communications plug 13, 14 at each end thereof. Typically, the cable 12 includes eight insulated conductors. As shown in FIG. 1, plug 14 is inserted into an opening or "plug aperture" 16 in the front side of the communications jack 15 so that the contacts or "plug blades" of communications plug 14 mate with respective contacts of the communications jack 15. If the cable 12 includes eight conductors, the communications plug 14 and the communications jack 15 will typically each have eight contacts. The communications jack 15 includes a wire connection assembly 17 at the back end thereof that receives a plurality of conductors (e.g., eight) from a second cable 18 that are individually pressed into slots in the wire connection assembly 17 to establish mechanical and electrical connections between each conductor of the second cable 18 and a respective one of a plurality of conductive paths through the communications jack 15. The other end of the second cable 18 is connected to, for example, a network server 20 which may be located, for example, in a telecommunications closet of a commercial office building. Communications plug 13 similarly is inserted into the plug aperture of a second communications jack (not pictured in FIG. 1) that is provided in the back of the computer 11. Thus, the patch cord 12, the cable 18 and the communications jack 15 provide a plurality of electrical paths between the computer 11 and the network server 20. These electrical paths may be used to communicate electrical information signals between the computer 11 and the network server 20. While not shown in FIG. 1 to simplify the drawing, typically additional equipment (e.g., patch panels, network switches, etc.), patch cords and cables are interposed between cable 18 and network server 20.

When a signal is transmitted over a conductor (e.g., an insulated copper wire) of a communications cable, electrical noise from external sources may be picked up by the conductor, degrading the quality of the signal. In order to counteract such noise sources, the information signals in the above-described communications systems are typically transmitted between devices over a pair of conductors (hereinafter a "differential pair" or simply a "pair") rather than over a single conductor using differential signaling techniques. The two conductors of each differential pair are twisted tightly together in the communications cables and patch cords so that the eight conductors are arranged as four twisted differential pairs of conductors. The signals transmitted on each conductor of a differential pair have equal magnitudes, but opposite phases, and the information signal is embedded as the voltage difference between the signals carried on the two conductors of the pair. When an information signal is transmitted using differential signaling techniques over a twisted differential pair of conductors, each conductor in the differential pair often picks up approximately the same amount of noise from these external sources. Because the information signal is extracted by taking the difference of the signals carried on the two conductors of the differential pair, the subtraction process may mostly cancel out the noise signal, and hence the information signal is typically not disturbed.

Referring again to FIG. 1, it can be seen that a series of plugs, jacks and cable segments connect the computer 11 to the server 20. Each plug, jack and cable segment includes four differential pairs, and thus a total of four differential transmission lines are provided between the computer 11 and the server 20 that may be used to carry two way communications therebetween (e.g., two of the differential pairs may be used to carry signals from the computer 11 to the server 20, while the other two differential pairs may be used to carry signals from the server 20 to the computer 11). Unfortunately, the proximities of the conductors and contacting structures of the four differential pairs within each plug-jack connection (e.g., where plug 14 mates with jack 15) can produce capacitive and/or inductive couplings between the conductors/contacts of different differential pairs. These capacitive and inductive couplings in the connectors (and similar couplings that may arise in the cabling) give rise to another type of noise that is known as "crosstalk."

In particular, "crosstalk" refers to unwanted signal energy that is capacitively and/or inductively coupled onto the conductors of a first "victim" differential pair from a signal that is transmitted over a second "disturbing" differential pair. The induced crosstalk may include both near-end crosstalk (NEXT), which is the crosstalk measured at an input location corresponding to a source at the same location (i.e., crosstalk whose induced voltage signal travels in an opposite direction to that of an originating, disturbing signal in a different path), and far-end crosstalk (FEXT), which is the crosstalk measured at the output location corresponding to a source at the input location (i.e., crosstalk whose signal travels in the same direction as the disturbing signal in the different path). Both types of crosstalk comprise an undesirable noise signal that interferes with the information signal that is transmitted over the victim differential pair.

While methods are available that can significantly reduce the effects of crosstalk within communications cable segments, the connector configurations that were adopted years ago—and which still are in effect in order to maintain backwards compatibility—generally did not arrange the connector contact structures so as to minimize crosstalk between the differential pairs in the connector hardware. For example, pursuant to the ANSI/TIA-568-C.2 standard approved Aug. 11, 2009 by the Telecommunications Industry Association, in the connection region where the contacts of a modular plug mate with the contacts of the modular jack (referred to herein as the "plug-jack mating region"), the eight contacts 1-8 of the jack must be aligned in a row, with the eight contacts 1-8 arranged as four differential pairs specified as depicted in FIG. 2. As known to those of skill in the art, under the TIA/EIA 568 type B configuration, contacts 4 and 5 in FIG. 2 comprise pair 1, contacts 1 and 2 comprise pair 2, contacts 3 and 6 comprise pair 3, and contacts 7 and 8 comprise pair 4. The eight plug blades of a mating plug are similarly aligned in a row so that they will mate with respective jack contacts 1-8. As is apparent from FIG. 2, this arrangement of the eight contacts 1-8 in the jack (and the similar arrangement of the eight corresponding blades of a mating plug) will result in unequal coupling between the differential pairs, and hence both NEXT and FEXT is introduced in each connector in industry standardized communications systems.

As hardwired communications systems have moved to higher frequencies in order to support increased data rate communications, crosstalk in the plug and jack connectors has became a more significant problem. To address this problem, communications jacks now routinely include crosstalk compensation circuits that introduce compensating crosstalk that is used to cancel much of the "offending" crosstalk that is introduced in the plug-jack mating region as a result of the industry-standardized connector configurations. Typically, so-called "multi-stage" crosstalk compensation circuits are used. Such crosstalk circuits are described in U.S. Pat. No. 5,997,358 to Adriaenssens et al. ("the '358 patent"), the entire content of which is hereby incorporated herein by reference as if set forth fully herein.

Another important parameter in communications connectors is the return loss that is experienced along each differential pair through the connector. The return loss of a transmission line is a measure of how well the transmission line is impedance matched with a terminating device or with loads that are inserted along the transmission line. In particular, the return loss is a measure of the signal power that is lost due to signal reflections that may occur at discontinuities (impedance mismatches) in the transmission line. High return loss values indicate a good impedance match (i.e., little signal loss due to reflection), which is desirable.

SUMMARY

Pursuant to embodiments of the present invention, patch cords are provided that include a communications cable that includes a first conductor and a second conductor that are twisted together to form a second differential pair of conductors, a third conductor and a sixth conductor that are twisted together to form a third differential pair of conductors, a fourth conductor and a fifth conductor that are twisted together to form a first differential pair of conductors, and a seventh conductor and an eighth conductor that are twisted together to form a fourth differential pair of conductors. These patch cords further include a plug that is attached to the communications cable. The plug includes a housing that receives the communications cable; a printed circuit board that is at least partly within the housing; a first plug contact that is electrically connected to the first conductor via a first conductive path on the printed circuit board, a second plug contact that is electrically connected to the second conductor via a second conductive path on the printed circuit board, a third plug contact that is electrically connected to the third conductor via a third conductive path on the printed circuit board, a fourth plug contact that is electrically connected to the fourth conductor via a fourth conductive path on the printed circuit board, a fifth plug contact that is electrically connected to the fifth conductor via a fifth conductive path on the printed circuit board, a sixth plug contact that is electrically connected to the sixth conductor via a sixth conductive path on the printed circuit board, a seventh plug contact that is electrically connected to the seventh conductor via a seventh conductive path on the printed circuit board, and an eighth plug contact that is electrically connected to the eighth conductor via an eighth conductive path on the printed circuit board, where the first through eighth plug contacts are arranged in a row in numerical order; and a wire guide that has a top shelf that extends above a top surface of the printed circuit board and a bottom shelf that extends below a bottom surface of the printed circuit board. Two of the first through fourth differential pairs of conductors are routed into respective first and second channels in the top shelf of the wire guide and the other two of the first through fourth differential pairs of conductors are routed into respective third and fourth channels in the bottom shelf of the wire guide.

In some embodiments, the first differential pair of conductors is routed into one of the first through fourth channels that is on one of the top shelf or the bottom shelf and the third differential pair of conductors is routed into one of the first through fourth channels that is on the other of the top shelf or the bottom shelf.

In some embodiments, the row in which the first through eight plug contacts are arranged extends from a left side of the printed circuit board to a right side of the printed circuit board. The plug may further include first through eighth wire termination contacts mounted on the printed circuit board that receive the respective first through eighth conductors, where the third wire termination contact is mounted to the right of the sixth wire termination contact and the fourth wire termination contact is mounted to the left of the fifth wire termination contact.

In some embodiments, the first through eighth wire termination contacts are insulation piercing contacts.

In some embodiments, the communications cable has a first height above a first plane defined by the top surface of the printed circuit board and the communications cable has a second height below a second plane defined by the bottom surface of the printed circuit board, where the first height is substantially equal to the second height.

In some embodiments, a twist terminator is provided in at least one of the first through fourth channels.

In some embodiments, the communications cable further includes a jacket that surrounds the first through eighth conductors, and for all possible variations of twist positions for the conductors of the first through fourth differential pairs of conductors from the point where the conductors exit a jacket of the communications cable to the point where the conductors of each of the first through fourth differential pairs pass through the vertical center of the respective twist terminator included in the respective one of the first through fourth channels that receive the respective first through fourth differential pairs, the near-end crosstalk variation between the third differential pair and each of the first, second and fourth differential pairs is less than respective predetermined values.

In some embodiments, the wire guide includes a crosstail which includes at least one recess that is configured to receive a separator of the communications cable.

In some embodiments, a first air gap is provided between the first and second channels in the top shelf of the wire guide and a second air gap is provided between the third and fourth channels in the bottom shelf of the wire guide.

In some embodiments, the printed circuit board has a front edge, a rear edge and left and right side edges that each extend between the front edge and the rear edge, the first through eight wire termination contacts are mounted in respective first through eighth metal-plated vias in the printed circuit board, and the third and fifth metal-plated vias are mounted in a first transverse row that extends between the left side and the right side of the printed circuit board, and the fourth and sixth metal-plated vias are mounted in a second transverse row that extends between the left side and the right side of the printed circuit board.

Pursuant to further embodiments of the present invention, patch cords are provided that include a communications cable that includes a first conductor and a second conductor that are twisted together to form a second differential pair of conductors, a third conductor and a sixth conductor that are twisted together to form a third differential pair of conductors, a fourth conductor and a fifth conductor that are twisted together to form a first differential pair of conductors, and a seventh conductor and an eighth conductor that are twisted together to form a fourth differential pair of conductors; and a plug that is attached to the communications cable. The plug includes a housing that receives the communications cable; a printed circuit board mounted at least partly within the housing; and first through eighth wire termination contacts mounted in the printed circuit board that receive the respective first through eighth conductors. The third wire termination contact is mounted directly next to and to the right of the sixth wire termination contact, the fourth wire termination contact is mounted directly next to and to the left of the fifth wire termination contact, and the third and sixth wire termination contacts are mounted to extend in a first direction that is perpendicular to a top surface of the printed circuit board and the fourth and fifth wire termination contacts are mounted to extend in a second direction that is perpendicular to the top surface of the printed circuit board, the second direction being opposite the first direction.

In some embodiments, the first direction is an upward direction and the second direction is a downward direction so that the third and sixth wire termination contacts extend upwardly from the top surface of the printed circuit board and the fourth and fifth wire termination contacts extend downwardly from a bottom surface of the printed circuit board.

In some embodiments, the first direction is a downward direction and the second direction is an upward direction so that the third and sixth wire termination contacts extend downwardly from a bottom surface of the printed circuit board and the fourth and fifth wire termination contacts extend upwardly from the top surface of the printed circuit board.

In some embodiments, the printed circuit board has a front edge, a rear edge and left and right side edges that each extend between the front edge and the rear edge. The first through eight wire termination contacts are mounted in respective first through eighth metal-plated vias in the printed circuit board, and the third and fifth metal-plated vias are mounted in a first transverse row that extends between the left side and the right side of the printed circuit board, and the fourth and sixth metal-plated vias are mounted in a second transverse row that extends between the left side and the right side of the printed circuit board.

In some embodiments, the plug further includes a wire guide that has a first shelf that extends along a first face of the printed circuit board and second shelf that extends along a second face of the printed circuit board, and first and second differential pairs of conductors are routed into respective first and second channels in the first shelf of the wire guide and the third and fourth differential pairs of conductors are routed into respective third and fourth channels in the second shelf of the wire guide.

In some embodiments, the first shelf is a top shelf that extends above a top surface of the printed circuit board and the second shelf is a bottom shelf that extends below a bottom surface of the printed circuit board.

In some embodiments, the first shelf is a bottom shelf that extends below a bottom surface of the printed circuit board and the second shelf is a top shelf that extends above a top surface of the printed circuit board.

In some embodiments, the communications cable has a first height above a first plane defined by the top surface of the printed circuit board and the communications cable has a second height below a second plane defined by a bottom surface of the printed circuit board, where the first height is substantially equal to the second height.

In some embodiments, a twist terminator is provided in at least one of the first through fourth channels.

In some embodiments, the wire guide includes a crosstail which includes at least one recess that is configured to receive a separator of the communications cable.

Pursuant to still further embodiments of the present invention, communications connectors are provided that include a housing; a printed circuit board mounted at least partially within the housing, the printed circuit board including first through eighth metal-plated vias; first through eighth contacts mounted in the first through eighth metal-plated vias, respectively, the first through eighth contacts configured as first to fourth differential pairs of contacts; and a first conductive trace having a first curved segment that forms a first annular ring-to-via capacitor with the first metal-plated via.

In some embodiments, the communications connector further includes a second conductive trace having a second curved segment that forms a second annular ring-to-via capacitor with the second metal-plated via.

In some embodiments, the communications connector is an RJ-45 plug, and the first through eighth contacts comprise first through eighth plug blades.

In some embodiments, the first curved segment extends at least halfway around the first metal-plated via.

In some embodiments, the printed circuit board extends in a longitudinal direction, a transverse direction and a vertical direction that are perpendicular to each other. Each of the first through eighth metal-plated vias extend through the printed circuit board in the vertical direction, each of the first through eighth plug blades extends in the longitudinal direction, and the first through eighth metal-plated vias are aligned in at least two transverse rows.

In some embodiments, the first through eighth plug blades are transversely aligned in numerical order, and the first conductive trace is electrically connected to the sixth metal-plated via, and the second conductive trace is electrically connected to the third metal-plated via.

In some embodiments, each of the first through eighth plug blades includes a blade portion having a bottom surface that extends along a top surface of the printed circuit board, a downwardly extending projection that is received within a respective one of the first through eighth metal-plated vias, and at least one of the plug blades includes an air gap between at least some portion of the bottom surface thereof and a top surface of the printed circuit board when the plug blade is mounted on the printed circuit board.

In some embodiments, the first annular ring-to-via capacitor comprises an offending crosstalk capacitor.

Pursuant to yet additional embodiments of the present invention, communications plugs are provided that include a housing; a printed circuit board mounted at least partly within the housing; a wire guide having a top shelf that extends onto a top surface of the printed circuit board and a bottom shelf that extends onto a bottom surface of the printed circuit board, the wire guide further including a rearwardly extending member that forms a crosstail. The rearwardly extending member includes at least one slot that is configured to receive a portion of a separator of a communications cable.

In some embodiments, the wire guide further includes first and second spaced-apart, longitudinally extending channels in the top shelf and third and fourth spaced-apart, longitudinally extending channels in the bottom shelf.

In some embodiments, each of the first through fourth longitudinally extending channels includes a twist terminator.

In some embodiments, a first air gap is provided in the wire guide between the first and second spaced-apart, longitudinally extending channels and a second air gap is provided in the wire guide between the third and fourth spaced-apart, longitudinally extending channels.

In some embodiments, the wire guide includes a crosstail that includes a recess which is configured to receive a separator of the communications cable.

In some embodiments, the first differential pair of conductors is routed into one of the first through fourth channels that is on one of the top shelf or the bottom shelf and the fourth differential pair of conductors is routed into one of the first through fourth channels that is on the other of the top shelf or the bottom shelf.

Pursuant to yet further embodiments of the present invention, RJ-45 plugs are provided that include a housing that receives a communications cable having first through eighth conductors; a printed circuit board that is at least partly within the housing; and first through eighth plug blades that are electrically connected to the respective first through eighth conductors of the communications cable. Each plug blade includes a blade portion having a bottom surface that extends along a top surface of the printed circuit board, a downwardly extending projection that is received within a respective one of the first through eighth metal-plated vias. The bottom surface of the first plug blade includes a recessed region that forms an air gap between a portion of the bottom surface of the first plug blade and a top surface of the printed circuit board when the first plug blade is mounted on the printed circuit board.

In some embodiments, bottom surfaces of the second through eighth plug blades each includes a respective recessed region that forms a respective air gap between a portion of the bottom surface of the respective plug blade and the top surface of the printed circuit board when the respective plug blades are mounted on the printed circuit board.

BRIEF DESCRIPTION OF THE DRAWINGS

FIG. 9 is a perspective view of the plug contacts and a printed circuit board of the plug of FIG. 4.

FIG. 10 is a schematic side view of the printed circuit board of FIG. 9 that illustrates the layer construction thereof.

FIG. 11 is a top view of a printed circuit board of FIG. 9.

FIGS. 16A and 16B are top perspective views of the wire guides that are included on the two plugs of the patch cord of FIG. 3.

FIG. 17 is a top view of a portion of the wire guide of the plug of FIG. 4.

DETAILED DESCRIPTION

Figure 1:
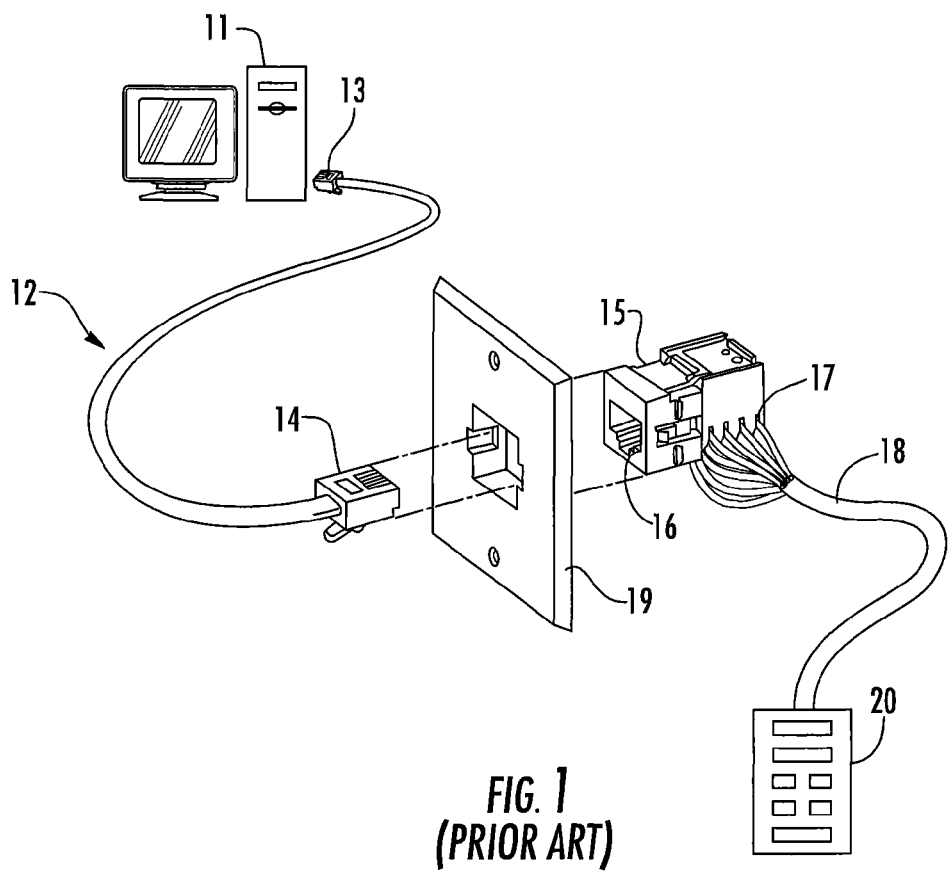
FIG. 1 is a simplified schematic diagram illustrating the use of conventional communications plugs and jacks to interconnect a computer with a network server.
Figure 2:
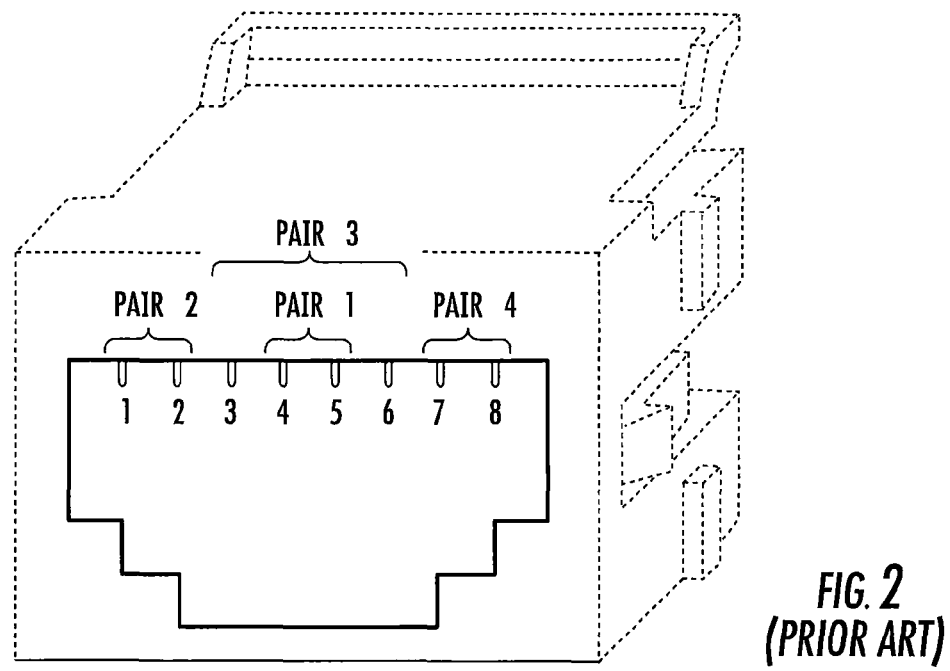
FIG. 2 is a schematic diagram illustrating the modular jack contact wiring assignments for a conventional 8-position communications jack (TIA 568B) as viewed from the front opening of the jack.

The present invention is directed to communications patch cords and the plug designs therefore. The communications patch cords and plugs according to embodiments of the present invention may exhibit excellent crosstalk performance.

In some embodiments, the plugs of the patch cords may include a printed circuit board and a plurality of low-profile plug contacts that are mounted on the top surface of the printed circuit board along a front edge thereof. The communications plugs may comprise RJ-45 plugs that have eight plug contacts that are arranged as four differential pairs of plug contacts. The plugs may further include a wire guide that may reduce and control crosstalk in the back end of the plugs where the conductors of a communications cable are terminated onto the printed circuit boards of the plugs. In some embodiments, the wire guide may include a number of crosstalk reduction and control features including (1) an isolation crosstail that may fit within the end portion of the cable jacket to separate the differential pairs of conductors at the cable-plug interface, (2) a slot in this crosstail that allows a separator tape of the cable to extend all the way to wire guide, (3) channels for each differential pair of conductors of the cable that control the separation thereof, (4) twist terminators that control the location where each differential pair of conductors transitions from a twisted to an untwisted configuration and (5) air gaps in the wire guide between adjacent differential pairs of conductors that decrease the coupling therebetween.

In some embodiments, the communications plugs may include one or more of various other crosstalk control and reduction features including (1) termination of the differential pairs of conductors onto both sides of the printed circuit board to increase the distance between pairs, (2) floating image planes on the printed circuit board to reduce coupling, (3) a reduced distance (and hence reduced coupling) between the end of the cable jacket and the twist terminators in the wire guide, (4) a pair 3 crossover on the printed circuit board and compensating crosstalk circuits that reduce differential-to-common mode crosstalk between pair 3 and pairs 2 and 4, and (5) the use of low profile plug blades in combination with offending crosstalk capacitors on the printed circuit board to increase the amount of offending crosstalk injected close to the plug-jack mating point.

The patch cords and plugs according to embodiments of the present invention may also include one or more of a number of other features that may provide improved performance. For example, in some embodiments, the plugs may use press-fit plug blades and/or wire connection contacts that may avoid the need for soldering and hence reduce manufacturing costs. The patch cords may also use different plugs on each end thereof that have different printed circuit board and/or wire guide designs that may further improve crosstalk performance. The tip and ring conductors of the differential pairs in the cable may terminate into the printed circuit board of the plug in different positions that are selected to further reduce crosstalk. Additionally, the vertical center-point of the communication cable may be substantially aligned with the vertical center-point of the printed circuit board of each plug to equalize the distance each differential pair of conductors extends beyond the end of the cable jacket, which may also improve crosstalk performance.

Additionally, pursuant to further embodiments of the present invention, annular ring-to-via capacitors are disclosed that may be implemented on the printed circuit boards of the communications plugs according to embodiments of the invention, or in other connector designs such as, for example, communications jacks. These annular ring-to-via capacitors may provide more consistent capacitance levels, use less printed circuit board area, and provide higher capacitance values than traditional printed circuit board capacitors.

Embodiments of the present invention will now be discussed in greater detail with reference to the drawings. Herein, when the communications plugs and patch cords according to embodiments of the present invention include multiple of the same elements such as, for example, plug contacts, the elements may be referred to individually by their full reference number (e.g., plug contact 260-3) and may be referred to collectively by the first part of their reference numeral (e.g., the plug contacts 260).

As used herein, the terms "forward" and "front" and derivatives thereof refer to the direction defined by a vector extending from the center of the plug toward the portion of the plug that is first received within a plug aperture of a jack when the plug is mated with a jack. Conversely, the term "rearward" and derivatives thereof refer to the direction directly opposite the forward direction. The forward and rearward directions define the longitudinal dimension of the plug. The vectors extending from the center of the plug toward the respective sidewalls of the plug housing define the transverse dimension of the plug. The transverse dimension is normal to the longitudinal dimension. The vectors extending from the center of the plug toward the respective top and bottom walls of the plug housing (where the top wall of the plug housing is the wall that includes slots that expose the plug blades) defines the vertical dimension of the plug. The vertical dimension of the plug is normal to both the longitudinal and transverse dimensions.

Figure 3:
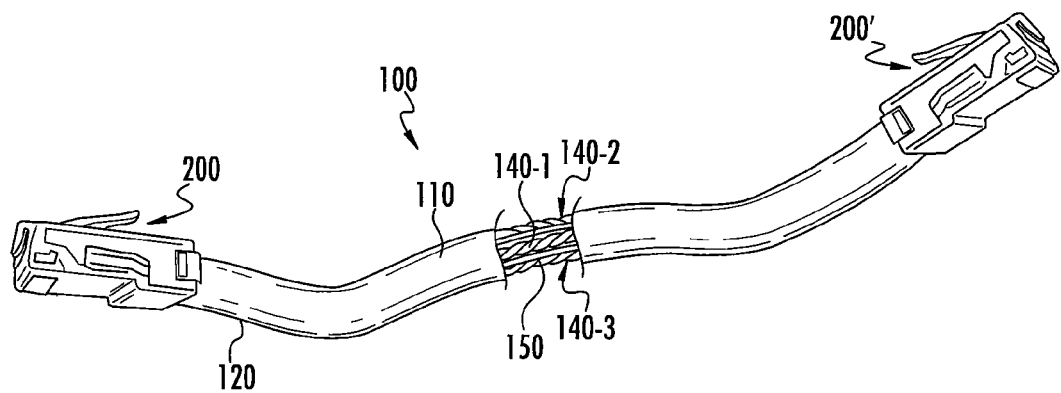
FIG. 3 is a perspective view of a patch cord according to certain embodiments of the present invention.

FIG. 3 is a perspective view of a patch cord 100 according to certain embodiments of the present invention. As shown in FIG. 3, the patch cord 100 includes a cable 110 that has eight insulated conductors 130-1 though 130-8 enclosed in a jacket 120 (the insulated conductors 130 are not individually numbered in FIG. 3 but are numbered in various other of the figures, and insulated conductors 130-7 and 130-8 are not visible in FIG. 3). The insulated conductors 130-1 though 130-8 may be arranged as four twisted differential pairs of conductors, with conductors 130-4 and 130-5 twisted together to form twisted pair 140-1, conductors 130-1 and 130-2 twisted together to form twisted pair 140-2, conductors 130-3 and 130-6 twisted together to form twisted pair 140-3, and conductors 130-7 and 130-8 twisted together to form twisted pair 140-4 (pair 140-4 is not visible in FIG. 3). Herein differential pairs 140-1, 140-2, 140-3 and 140-4 may be referred to simply as "pair 1," "pair 2," "pair 3" and "pair 4," respectively.

A separator tape 150 may be provided that separates two of the twisted pairs 140-1 through 140-4 from the other two twisted pairs 140-1 through 140-4. A first plug 200 is attached to a first end of the cable 110 and a second plug 200' is attached to the second end of the cable 110 to form the patch cord 100. Strain relief features (not shown) such as boots or ferrules, for example, may be attached to each of the plugs 200, 200' which resist the tendency for a longitudinal force applied to the cable 110 to pull the cable 110 out of the plugs 200, 200'.

Figure 4:
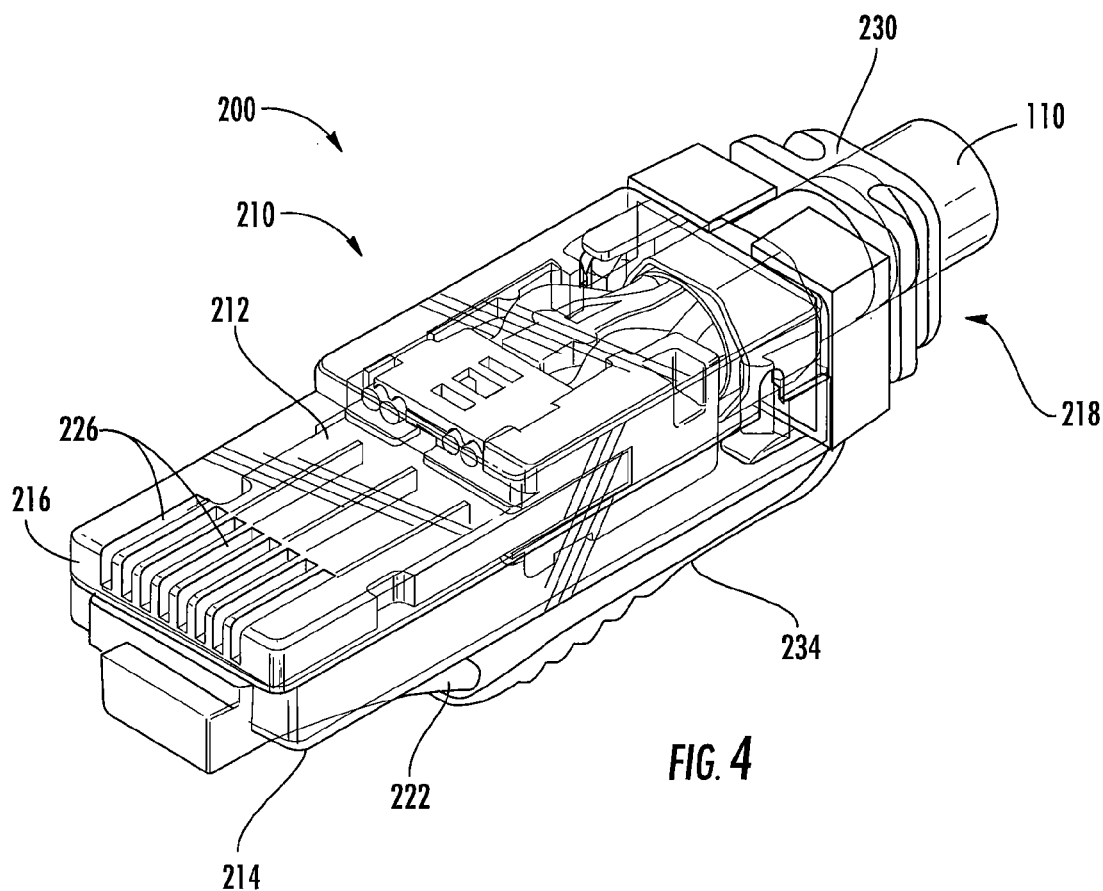
FIG. 4 is a top-front perspective view of a plug that is included on the patch cord of FIG. 3.
Figure 7:
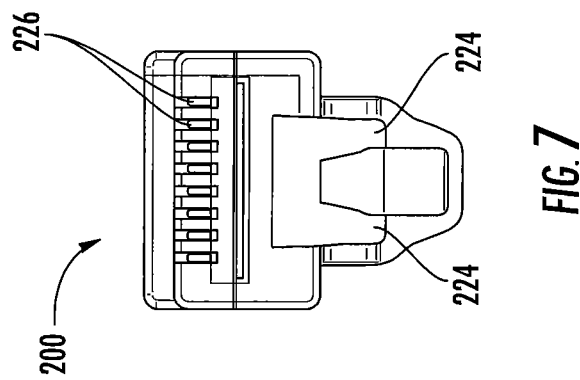
FIG. 7 is a front view of the plug of FIG. 4.
Figure 5:
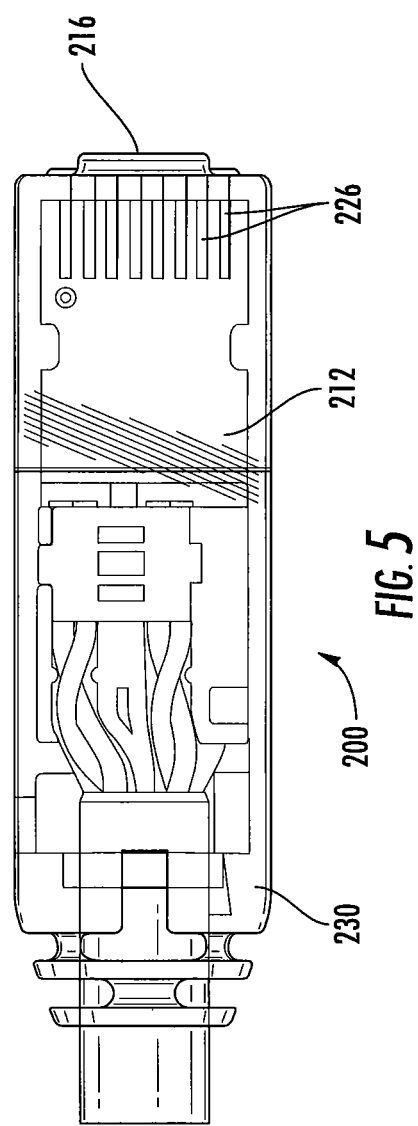
FIG. 5 is a top view of the plug of FIG. 4.
Figure 6:
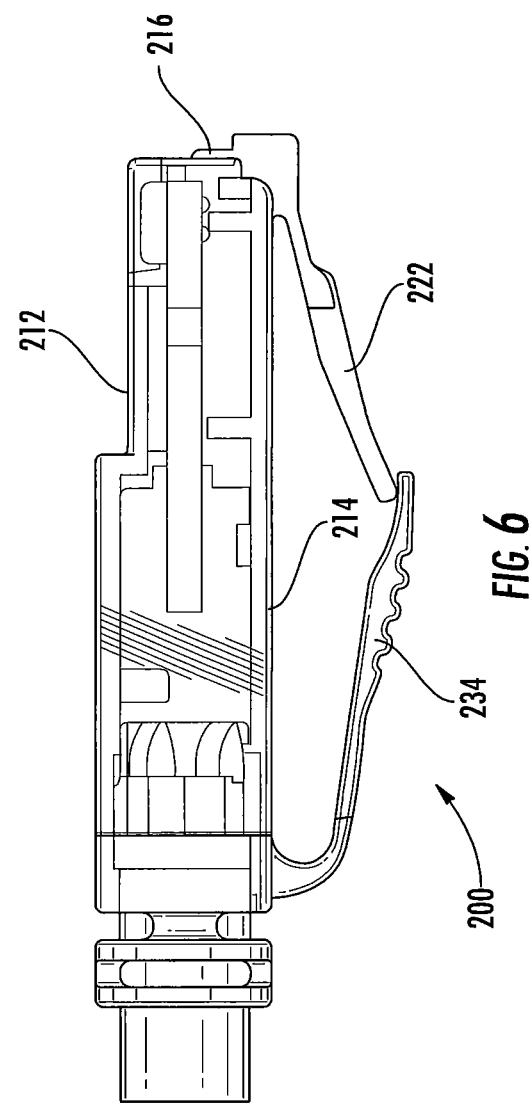
FIG. 6 is a side view of the plug of FIG. 4.

FIGS. 4-7 are various views that illustrate external features of the first plug 200 of the patch cord 100 in greater detail. In particular, FIG. 4 is a top-front perspective view of the plug 200, FIG. 5 is a top view of the plug 200, FIG. 6 is a side view of the plug 200 and FIG. 7 is a front view of the plug 200.

Referring to FIGS. 4-7, the communications plug 200 includes a housing 210 that has a top surface 212, a bottom surface 214, a front surface 216, and a rear opening 218 that receives a rear cap 230. The housing 210 may be made of a suitable insulative plastic material that meets applicable standards with respect to, for example, electrical breakdown resistance and flammability such as, for example, polycarbonate, ABS, ABS/polycarbonate blend or other molded dielectric materials.

A plug latch 222 extends from the bottom surface 214 of the housing 210. As known to those of skill in the art, stops 224 that are included at the base of the plug latch 222 operate in conjunction with stops in a mating communications jack (not shown) to prevent the plug 200 from being removed from the communications jack once the plug 200 has been fully inserted therein. By applying an upwardly-directed force to the plug latch 222, the stops 224 may clear the corresponding stops in the communications jack, allowing the plug 200 to be removed from the communications jack.

A plurality of longitudinally extending slots 226 are provided along the front portion of the top surface 212 and these slots 226 extend onto the front surface 216 of the housing 210. The communications cable 110 (see FIG. 3) is received through the rear opening 218. The rear cap 230 includes a cable aperture 232 (see FIG. 8) that receives the cable 110, and the rear cap 234 locks into place within the rear opening 218 of housing 210 after the communications cable 110 has been inserted therein. The rear cap 230 further includes a secondary latch 234 that extends forwardly to engage an underside of the plug latch 222. A technician can apply an upwardly-directed force to either the plug latch 222 or the secondary latch 234 to disengage the stops 224 from the mating stops in the communications jack so that the plug 200 can be removed therefrom.

Figure 8:
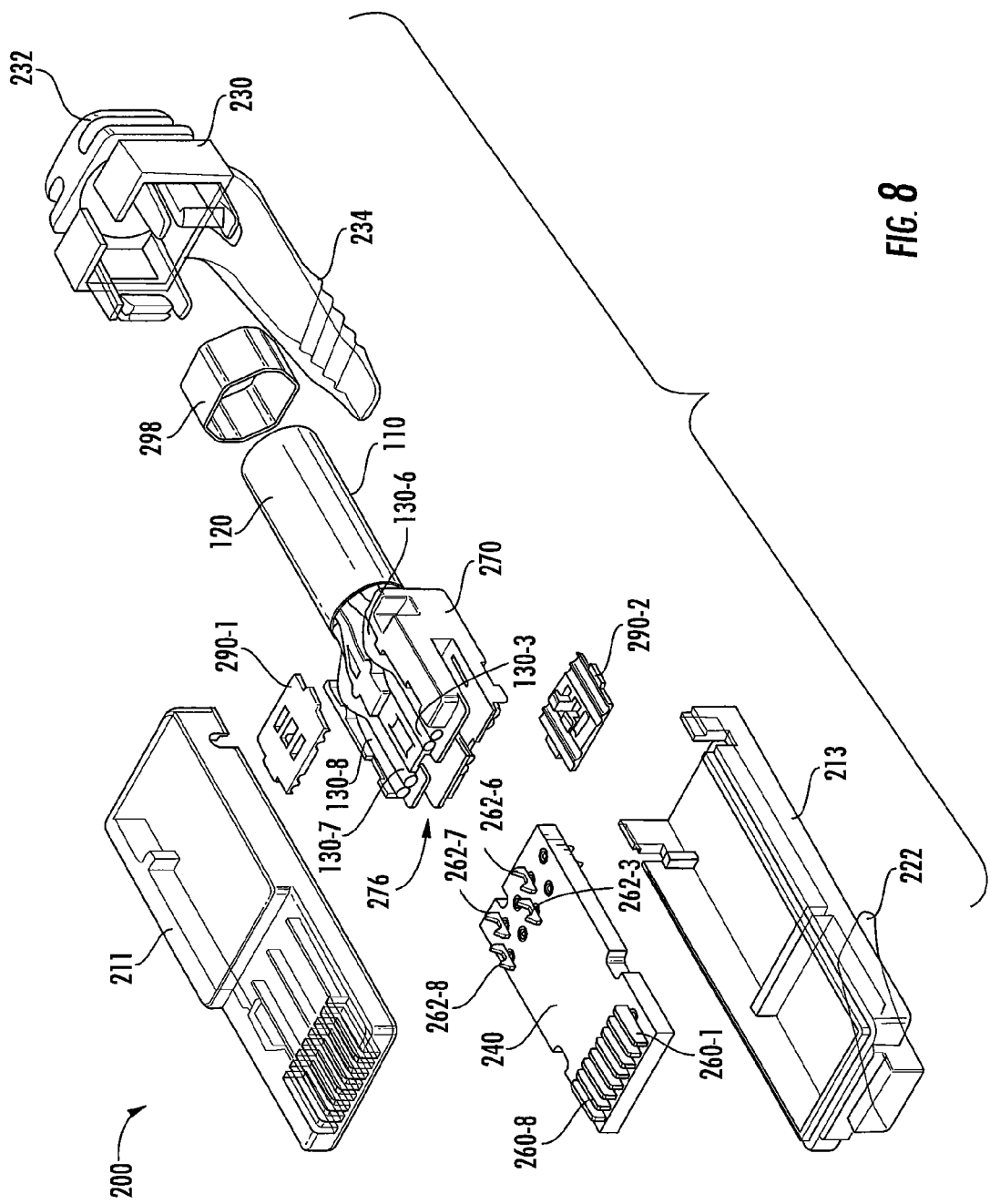
FIG. 8 is an exploded perspective top view of the plug of FIG. 4.

FIG. 8 is an exploded perspective view of the plug 200 of FIGS. 4-7. As shown in FIG. 8, the plug housing 210 comprises a three piece housing that includes a top piece 211, a bottom piece 213 and the rear cap 230. As is also shown in FIG. 8, the plug 200 further includes a printed circuit board 240 which is mounted within the housing 210. A plurality of plug contacts 260-1 through 260-8 in the form of low profile plug blades are mounted at the forward edge of the printed circuit board 240 so that the plug blades 260-1 through 260-8 can be accessed through the slots 226 in the top surface 212 and front surface 216 of the housing 210. Only plug blades 260-1 and 260-8 are individually numbered in FIG. 8 to simplify the drawing, but it will be appreciated that the plug blades 260-1 through 260-8 are arranged in a transverse row in numerical order, as is conventional. A plurality of wire connection contacts 262-1 through 262-8 in the form of insulation piercing contacts are mounted adjacent the rear edge of the printed circuit board 240. In the depicted embodiment, four of the insulation piercing contacts 262-3 and 262-6 through 262-8 are mounted to extend upwardly from the printed circuit board 240, while the other four insulation piercing contacts 262-1, 262-2, 262-4 and 262-5 extend downwardly from the printed circuit board 240. Consequently, only insulation piercing contacts 262-3 and 262-6 through 262-8 are clearly visible in FIG. 8.

Still referring to FIG. 8, the plug 200 further includes a wire guide 270, upper and lower wire caps 290-1, 290-2 and a strain relief ring 298. The rear edge of the printed circuit board 240 is received within a slot 276 of the wire guide 270. The communications cable 110 of patch cord 100 is received through the cable aperture 232 of the rear cap 230. An end portion of the cable jacket 120 is removed during assembly so that the insulated conductors 130-1 through 130-8 extend forwardly beyond the end of the cable jacket 120. The insulated conductors 130-1 through 130-8 (e.g., insulated wires) of the communications cable 110 are terminated into corresponding longitudinally extending channels in the wire guide 270, as will be discussed in more detail below. The cable 110 passes through the strain relief ring 298, which resides within the rear cap 230. When the rear cap 230 is locked in place within the opening 218 in the rear surface of the housing 210 the strain relief ring 298 is axially compressed onto the communications cable 110 to firmly hold the cable 110 within the housing 210 even if rearwardly-directed longitudinal forces are applied to the communications cable 110.

The plug blades 260-1 through 260-8 are configured to make mechanical and electrical contact with respective contacts, such as, for example, spring jackwire contacts, of a mating communications jack. Each of the eight plug blades 260-1 through 260-8 is mounted at the front portion of the printed circuit board 240. The plug blades 260-1 through 260-8 may be substantially transversely aligned in a side-by-side relationship. Each of the plug blades 260-1 through 260-8 may comprise a thin (in the transverse direction), longitudinally-extending strip of metal such as copper. The height of each plug blade 260-1 through 260-8 above the top surface of the printed circuit board 240 may be reduced as compared to conventional plug blades (e.g., a height in the range of approximately 60 to 100 mils may be used in some embodiments). This reduced height may decrease capacitive coupling between adjacent plug blades 260-1 through 260-8.

Figure 20:
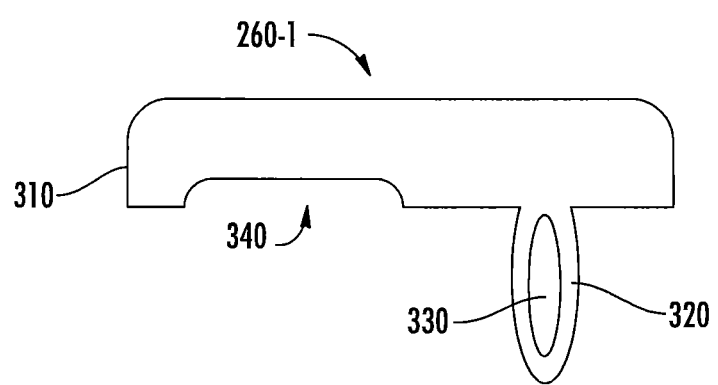
FIG. 20 is a side view of one of the plug blades of the plug of FIG. 4.

Each of the plug blades 260-1 through 260-8 may be fabricated separately from the printed circuit board 240. FIG. 20 is a side view of one of the plug blades 260. All eight plug blades 260 may be identical to each other. As shown in FIG. 20, each plug blade 260 may comprise, for example, an elongated metal blade 310 having a length of approximately 3.65 mm, a width of approximately 0.30 mm and a height (i.e., a thickness) of approximately 1.27 mm. Each plug blade 260 also includes a downwardly-extending projection 320 that is used to mount the plug blade 260 within a metal-plated aperture in the printed circuit board 240, as will be discussed in more detail below. In the depicted embodiment, the projection 320 has a cutout region 330 so that the projection has an eye-of-the-needle design so that it may be press-fit into a metal-plated aperture in the printed circuit board 240. In other embodiments, the projection 320 may comprise, for example, a solid post that may be welded or soldered into a metal-plated aperture in the printed circuit board 240.

Additionally, as is further shown in FIG. 20, in some embodiments, each plug blade 260 may include a notch 340 that comprises a recessed region along the lower portion of the metal blade 310. Because of the notch 340, an air gap is provided between a portion of the bottom surface of the plug blade 260 and a top surface of the printed circuit board 240. The notch 340 may increase the distance and thus the breakdown voltage between each plug blade 260 and the annular rings on the surface of the printed circuit board 240 around each of the metal-plated apertures 246 that receive the projections 320 of adjacent plug blades 260. In an alternative embodiment, a non-conductive coating may be provided along a portion of the bottom edge of each plug blade 260 (e.g., everywhere except the projection 320) to increase the distance, and hence the breakdown voltage, between each plug blade 260 and the annular rings on the surface of the printed circuit board 240 around each of the metal-plated apertures 246. While the notch 340 is illustrated in FIG. 20, it is not shown in the other drawings to simplify the figures. It will also be appreciated that the notch 340 may be omitted from some or all of the plug blades 260 in some embodiments.

The plug blades 260-1 through 260-8 may be mounted to the printed circuit board 240 in other ways. For example, in other embodiments, elongated contact pads may be provided on the top surface of the printed circuit board 240 and each plug blade 260-1 through 260-8 may be welded or soldered to a respective one of these contact pads. It will be appreciated that other attachment mechanisms may be used.

Figure 12:
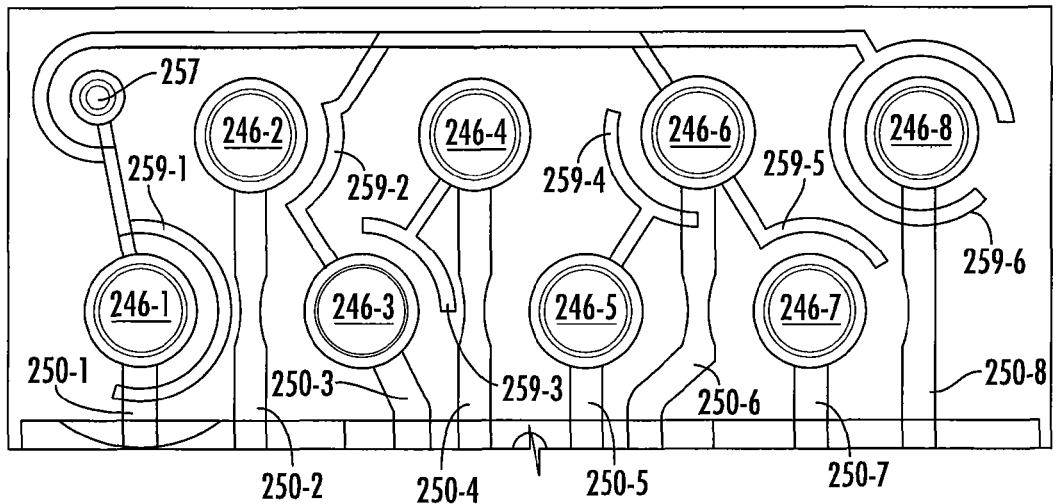
FIG. 12 is an enlarged top view of a front portion of the printed circuit board of FIG. 9.

FIGS. 9-12 are various views of the printed circuit board 240 of plug 200. In particular, FIG. 9 is a perspective view of the printed circuit board 240. FIG. 10 is a schematic side view of the printed circuit board 240 that illustrates the layer construction thereof. FIG. 11 is a top view of the printed circuit board 240. FIG. 12 is an enlarged top view of a front portion of the printed circuit board 240 that shows annular ring-to-via capacitors that are implemented therein.

Referring to FIGS. 9-11, the printed circuit board 240 comprises a multi-layered rigid structure having a plurality of conductive layers and a plurality of dielectric layers that are sequentially stacked. As shown in FIG. 10, in the depicted embodiment, the printed circuit board 240 includes four conductive layers 242-1 through 242-4 that are separated from each other by three dielectric layers 244-1 through 244-3. Dielectric material (not shown) may also be provided on the exposed bottom portion of the lowermost conductive layer 242-1 and on the exposed top portion of the uppermost conductive layer 242-4 to protect and insulate those layers. It will be appreciated that in other embodiments a flexible printed circuit board or a printed circuit board that includes both flexible and rigid portions may be used in place of the rigid printed circuit board 240 depicted in the figures.

As shown, for example, in FIGS. 9 and 11-12, eight metal-plated apertures 246-1 through 246-8 apertures extend vertically through the printed circuit board 240 adjacent a front edge thereof The metal-plated apertures 246-1 through 246-8 are arranged in two transverse rows, and each metal-plated aperture 246-1 through 246-8 is offset in the transverse direction from the other metal-plated apertures 246-1 through 246-8. As shown in FIGS. 9 and 20, each of the plug blades 260-1 through 260-8 includes a downwardly extending projection 320 that is received within a respective one of the metal-plated apertures 246-1 through 246-8 in order to mount the plug blades 260-1 through 260-8 so that they extend upwardly along the front edge of the printed circuit board 240. While the metal-plated apertures 246-1 through 246-8 are arranged in two transverse rows that are offset from each other in the longitudinal direction, the plug blades 260-1 through 260-8 may be aligned in a single row as the downwardly extending projections 320 of the plug blades 260-1 through 260-8 are located at different positions, as was discussed above with reference to FIGS. 20A and 20B.

Still referring to FIGS. 9 and 11, another eight metal-plated apertures 248-1 through 248-8 apertures extend vertically through the printed circuit board 240 adjacent a rear edge thereof. The metal-plated apertures 248-1 through 248-8 are arranged in two transverse rows, and each metal-plated aperture 248-1 through 248-8 is offset in the transverse direction from the other metal-plated apertures 248-1 through 248-8. As shown in FIG. 9, each of the insulation piercing contacts 262-1 through 262-8 includes a vertically extending projection that is received within a respective one of the metal-plated apertures 248-1 through 248-8 in order to mount the insulation piercing contacts 262-1 through 262-8 onto the printed circuit board 240. Insulation piercing contacts 262-3 and 262-6 through 262-8 extend upwardly from a top surface of the printed circuit board 240, while insulation piercing contacts 262-1, 262-2, 262-4 and 262-5 extend downwardly from a bottom surface of the printed circuit board 240. The metal-plated apertures 248-1 through 248-8 may be longitudinally aligned with respective ones of the metal-plated apertures 246-1 through 246-8, although this need not be the case.

Referring to FIGS. 9 and 11, a plurality of conductive paths 250-1 through 250-8 electrically connect metal-plated apertures 246-1 through 246-8 to metal-plated apertures 248-1 through 248-8, respectively. Conductive paths 250-1, 250-2, 250-7 and 250-8 each comprise a respective conductive trace that is part of conductive layer 242-4. Conductive paths 250-4 and 250-5 each comprise a respective conductive trace that is part of conductive layer 242-1. Conductive paths 250-3 and 250-6 each comprise one or more conductive traces that are formed on each of conductive layers 242-1, 242-2 and 242-4 as well as conductive vias 254 that extend vertically through the printed circuit board 240 to electrically connect conductive traces on different layers 242. In other embodiments, conductive paths 250-3 and 250-6 may only include conductive traces that are formed on conductive layers 242-1 and 242-4. The eight conductive paths 250-1 through 250-8 may comprise four differential pairs of conductive paths 252-1 through 252-4, each of which is configured to carry a differential signal. In particular, conductive paths 250-4 and 250-5 may form the first differential pair 252-1, conductive paths 250-1 and 250-2 may form the second differential pair 252-2, conductive paths 250-3 and 250-6 may form the third differential pair 252-3, and conductive paths 250-7 and 250-8 may form the fourth differential pair 252-4.

The insulated conductors 130-1 through 130-8 are electrically connected to the conductive paths 250-1 through 250-8, respectively via the insulation piercing contacts 262-1 through 262-8, respectively. The insulation piercing contacts 262 are depicted schematically in FIG. 9, to simplify the drawing, but it will be appreciated that various suitable insulation piercing contact designs are well known in the art. The differential pairs 140-1 through 140-4 of conductors 130 correspond to differential pairs 252-1 through 252-4 of conductive paths 250, respectively. As with the differential pairs 140 of insulated conductors 130, herein the differential pairs 252-1, 252-2, 252-3 and 252-4 of conductive paths 250 may also be referred to simply as "pair 1," "pair 2," "pair 3" and "pair 4," respectively. The context will make clear whether references to the different pairs are to the differential pairs 140 of insulated conductors 130, the differential pairs 252 of conductive paths 250, or both (e.g., references to crosstalk injected onto pairs encompassed by both the differential pair 140 of conductors 130 and the corresponding differential pairs 252 of conductive paths 250, as crosstalk injected onto one is necessarily injected onto the other).

A variety of crosstalk generating structures are also included on the printed circuit board 240. As known to those of skill in the art, crosstalk arises between the differential pairs in the industry standardized RJ-45 plug-jack interface due to the unequal coupling that occurs between the four differential transmission lines through RJ-45 plugs and jacks in the plug-jack mating region of the plug contacts. This crosstalk is conventionally referred to as "offending" crosstalk as it is unwanted coupling that necessarily arises because of the arrangement of the contacts in the interface specification. In order to reduce the impact of this offending crosstalk, communications jacks were developed in the early 1990s that included circuits that introduced so-called "compensating" crosstalk that was used to cancel much of the offending crosstalk that was being introduced in the plug-jack mating region.

In particular, in order to cancel the offending crosstalk that is generated in a plug-jack connector because a first conductor of a first differential pair inductively and/or capacitively couples more heavily with a first of the two conductors of a second differential pair than does the second conductor of the first differential pair (which necessarily occurs because the plug blades are aligned in a row), jacks were designed so that the second conductor of the first differential pair would capacitively and/or inductively couple with the first of the two conductors of the second differential pair later in the jack to provide a compensating crosstalk signal. As the first and second conductors of the differential pair carry equal magnitude, but opposite phase signals, so long as the magnitude of the "compensating" crosstalk signal that is induced in such a fashion is equal to the magnitude of the "offending" crosstalk signal, then the compensating crosstalk signal that is introduced later in the jack may substantially cancel out the offending crosstalk signal.

In order to ensure that plugs and jacks manufactured by different vendors will work well together, the industry standards now specify amounts of offending crosstalk that must be generated between the various differential pair combinations in an RJ-45 plug for that plug to be industry-standards compliant. Thus, while it is now possible to manufacture RJ-45 plugs that exhibit much lower levels of offending crosstalk, it is still necessary to ensure that RJ-45 plugs inject the industry-standardized amounts of offending crosstalk between the differential pairs so that backwards compatibility will be maintained with the installed base of RJ-45 plugs and jacks.

While the above-described crosstalk compensation techniques may work very well with signals having frequencies of, for example, about 100 MHz or less, they do not work as well with higher frequency signals. The problem is that the locations where the offending crosstalk and the compensating crosstalk are injected generally are spaced apart from each other, and hence the phase of the signals carried on the conductors will vary as the signals move between the locations where the offending and compensating crosstalk signals are injected. With higher frequency signals, the phase of the signal changes more quickly, and hence the phase of the compensating crosstalk signal will not be exactly opposite (i.e., 180 degrees more or less) the offending crosstalk signal, and therefore will not fully cancel the offending crosstalk signal. The effect of such delays and phase shifts on crosstalk compensation in communications connectors is explained in the aforementioned '358 patent.

One way, therefore, of reducing the amount of uncompensated crosstalk is to reduce the distance, and hence the delay, between the locations where the offending crosstalk and the compensating crosstalk are injected. As discussed above, RJ-45 communications plugs are required to have certain levels of offending crosstalk which are then cancelled by crosstalk compensation circuits in a mating jack. In order to make this cancellation more effective, one strategy is to reduce or minimize the amount of offending crosstalk that arises in the back end of the plug so that almost all of the offending crosstalk is injected very close to the plug-jack mating point, so that it will be closer to the compensating crosstalk circuits in the jack. As discussed below, the communications plugs according to embodiments of the present invention may have a number of crosstalk circuits (both offending and compensating) that reduce the amount of uncompensated offending crosstalk that is present in the rear portion of the plug so that almost all of the offending crosstalk will be injected in the front portion of the plug very close to the plug-jack mating point.

For example, as shown in FIG. 9, each of the internal conductive layers 242-2, 242-3 of the printed circuit board 240 includes a conductive image plane 256-1, 256-2. Each conductive image plane 256 may be implemented as a thin layer of metal having openings therein for the conductive vias 254. The conductive image planes 256 may reduce crosstalk between the differential pairs 252 of conductive paths 250, particularly with respect to differential pairs 252 of conductive paths 250 that are on conductive layers 242 of the printed circuit board 240 that have the conductive image plane 256 interposed therebetween. The conductive image planes 256 may be electrically floating layers (i.e., they are not electrically connected to a ground voltage or other reference voltage) in some embodiments. In other embodiments, (e.g., in embodiments in which the plug 200 is shielded) the conductive image planes 256 may be replaced with conductive ground planes that are electrically connected to a reference voltage such as earth ground.

As another example, as shown in FIG. 11, conductive paths 250-3 and 250-6 each have a complex arrangement as compared to the other six conductive paths 250 that is designed to reduce the amount of uncompensated offending crosstalk that is present in the back-end of the plug 200. In particular, conductive path 250-3 includes a first conductive trace in conductive layer 242-3 that extends from metal-plated aperture 248-3 to a conductive via 254-1, a second conductive trace in conductive layer 242-3 that extends from conductive via 254-1 to a conductive via 254-2, a third conductive trace in conductive layer 242-1 that extends from conductive via 254-2 to a conductive via 254-6, and a fourth conductive trace in conductive layer 242-1 that extends from conductive via 254-6 to metal-plated aperture 246-3. Conductive path 250-6 includes a first conductive trace in conductive layer 242-4 that extends from metal-plated aperture 248-6 to a conductive via 254-4, a second conductive trace in conductive layer 242-3 that extends from conductive via 254-4 to a conductive via 254-5, a third conductive trace in conductive layer 242-4 that extends from conductive via 254-5 to conductive via 254-3, and a fourth conductive trace in conductive layer 242-1 that extends from conductive via 254-3 to metal-plated aperture 246-6.

The conductive vias 254 that are used to transition conductive paths 250-3 and 250-6 between different of the conductive layers 242 allow the conductive paths 250-3 and 250-6 to cross over or under the conductive paths 250-4 and 250-5. These "crossovers" where one conductive path 250 crosses over or under another one of the conductive paths 250 when the printed circuit board 240 is viewed from above allow conductive path 250-3 to be routed directly adjacent to conductive path 250-5 near the center of the printed circuit board 240 to form a compensating crosstalk circuit 255-1 (which inductively couples compensating crosstalk between pairs 1 and 3) and to be routed directly adjacent to conductive path 250-4 near the front of the printed circuit board 240 to form an offending crosstalk circuit 259-7 (which inductively couples offending crosstalk between pairs 1 and 3). Likewise, the crossovers allow conductive path 250-6 to be routed directly adjacent to conductive path 250-4 near the center of the printed circuit board 240 to form a compensating crosstalk circuit 255-2 (which inductively couples compensating crosstalk between pairs 1 and 3) and to be routed directly adjacent to conductive path 250-5 near the front of the printed circuit board 240 to form an offending crosstalk circuit 259-8 (which inductively couples offending crosstalk between pairs 1 and 3). Conductive path 250-3 includes an inward jog between conductive vias 254-1 and 254-2 and conductive path 250-6 includes an inward jog between conductive vias 254-4 and 254-5, which serve to increase the amount of compensating crosstalk injected by compensating crosstalk circuits 255-1 and 255-2.

The compensating crosstalk circuits 255-1 and 255-2 may be used to cancel offending crosstalk between pairs 1 and 3 that is generated in the back end of the plug 200 and to also at least partially compensate the offending crosstalk that is generated in offending crosstalk circuits 259-7 and 259-8. As a result, the back end of plug 200 may have very little uncompensated crosstalk between pairs 1 and 3, and hence almost all of the offending crosstalk between pairs 1 and 3 that is mandated by the industry standards may be injected in the front of plug 200, very close to the plug jack mating points for plug blades 260-3 through 260-6.

The printed circuit board 240 also includes other crosstalk reduction features. For example, conductive paths 250-1 and 250-2 (differential pair 252-2) are formed solely on the uppermost conductive layer 242-4 of printed circuit board 240, while the next closest conductive paths (i.e., conductive paths 250-3 and 250-6) are mostly routed on the lowermost conductive layer 242-1 of printed circuit board 240. The increased distance between these conductive paths (due to the vertical separation) combined with the ability of the conductive image planes 256 to reduce coupling between conductive layers 242 may significantly reduce the coupling (crosstalk) between the conductive paths of differential pair 252-2 and the conductive paths of differential pair 252-3. Similarly, conductive paths 250-7 and 250-8 (differential pair 252-4) are formed solely on the uppermost conductive layer 242-4 of printed circuit board 240, while the next closest conductive paths (i.e., conductive paths 250-3, 250-5 and 250-6) are routed solely on the lowermost conductive layer 242-1 of printed circuit board 240 in regions where they come close to conductive paths 250-7 and 250-8 in order to further reduce crosstalk.

Additionally, four capacitive crosstalk compensation circuits 258-1 through 258-4 are also provided near the rear end of printed circuit board 240 adjacent the metal-plated apertures 248. In particular, a first capacitor is formed between a conductive trace that extends from metal-plated aperture 248-3 and metal-plated aperture 248-1 that forms a first capacitive crosstalk compensation circuit 258-1, a second capacitor is formed between a conductive trace that extends from metal-plated aperture 248-5 and metal-plated aperture 248-2 that forms a second capacitive crosstalk compensation circuit 258-2, a third capacitor is formed between a conductive trace that extends from metal-plated aperture 248-4 and metal-plated aperture 248-7 that forms a third capacitive crosstalk compensation circuit 258-3, and a fourth capacitor is formed between a conductive trace that extends from metal-plated aperture 248-5 and metal-plated aperture 248-8 that forms a fourth capacitive crosstalk compensation circuit 258-4.

The first capacitive crosstalk compensation circuit 258-1 injects compensating crosstalk between differential pairs 252-2 and 252-3. The second capacitive crosstalk compensation circuit 258-2 injects compensating crosstalk between differential pairs 252-1 and 252-2. The third and fourth capacitive crosstalk compensation circuits 258-3 and 258-4 inject compensating crosstalk between differential pairs 252-1 and 252-4. These capacitive crosstalk compensation circuits 258 compensate for offending crosstalk that is generated between pair combinations other than pairs 1 and 3 in the back end of plug 200.

A plurality of capacitive offending crosstalk circuits 259-1 through 259-6 are also included on the printed circuit board 240. The offending crosstalk circuits 259-1 through 259-6 are visible in FIG. 11, and are labeled in the enlarged view of FIG. 12. As noted above, the plug blades 260-1 through 260-8 may have a reduced height as compared to conventional plug blades, and hence they may inject less than the industry standardized amounts of offending crosstalk between the four differential pairs 252-1 through 252-4. As discussed above, the plug 200 also includes various crosstalk compensation circuits 255, 258 that are designed to reduce the amount of offending crosstalk generated between the four differential pairs 252-1 through 252-4 in other portions of the plug 200. Accordingly, in order to ensure that the plug 200 injects the industry-standardized amounts of offending crosstalk between the four differential pairs 252-1 through 252-4, six capacitive offending crosstalk circuits 259-1 through 259-6 are provided on the printed circuit board 240 adjacent the plug blades 240. These offending crosstalk circuits 259-1 through 259-6 are used to inject additional offending crosstalk between the pairs in order to bring the RJ-45 plug 200 into compliance with these industry standards.

The above-described approach may be beneficial because, as discussed above, more effective crosstalk cancellation may generally be achieved the closer the point of injection of the compensating crosstalk (or at least the first stage of compensating crosstalk) is to the point where the offending crosstalk is injected. The RJ-45 plug 200 is designed to generate low levels of offending crosstalk in the back portion of the plug (i.e., in portions of the plug 200 that are at longer electrical delays from the plug-jack mating regions of the plug blades 260-1 through 260-8). Moreover, the offending crosstalk circuits 259-1 through 259-6 that are used to generate much of the offending crosstalk may be located at very short delays from the plug-jack mating regions of the plug blades 260-1 through 260-8. As a result, the average amount of delay between the offending crosstalk in the plug 200 and the compensating crosstalk circuits in a mating jack may be reduced, which may allow for more effective cancellation of the offending crosstalk in a mating jack.

As shown in FIG. 12, a first capacitor is formed between a conductive trace that extends from metal-plated aperture 246-6 and metal-plated aperture 246-1 that forms a first capacitive offending crosstalk circuit 259-1. A second capacitor is formed between a conductive trace that extends from metal-plated aperture 246-3 and metal-plated aperture 246-2 that forms a second capacitive offending crosstalk circuit 259-2. A third capacitor is formed between a conductive trace that extends from metal-plated aperture 246-4 and metal-plated aperture 246-3 that forms a third capacitive crosstalk compensation circuit 259-3. A fourth capacitor is formed between a conductive trace that extends from metal-plated aperture 246-5 and metal-plated aperture 246-6 that forms a fourth capacitive crosstalk compensation circuit 259-4. A fifth capacitor is formed between a conductive trace that extends from metal-plated aperture 246-6 and metal-plated aperture 246-7 that forms a fifth capacitive crosstalk compensation circuit 259-6. A sixth capacitor is formed between a conductive trace that extends from metal-plated aperture 246-3 and metal-plated aperture 246-8 that forms a sixth capacitive crosstalk compensation circuit 259-3. A conductive via 257 is also provided that is connected to metal-plated aperture 246-1, and the conductive trace that extends from metal-plated aperture 246-6 to metal-plated aperture 246-1 wraps around the conductive via 257 to increase the amount of offending crosstalk generated by the first offending crosstalk circuit 259-1.

As can be seen with reference to FIGS. 9 and 11-12, each of the six offending crosstalk capacitors 259-1 through 259-6 is configured to inject offending crosstalk at a location that is very near to the plug-jack mating region of each plug blade 260-1 through 260-8.

The offending crosstalk capacitors 259-1 through 259-6 are implemented as annular ring-to-via capacitors. An "annular ring-to-via capacitor" refers to a generally curved conductive trace segment on a printed circuit board layer that is adjacent a metal-plated via or metal-plated aperture through the printed circuit board and that wraps around at least one sixth of the metal-plated via. The curve may be a smooth curve, but need not be (e.g., a plurality of linear segments may be joined to approximate a curve, or a combination of curved and linear segments may be used that wrap around a portion of the metal-plated via/aperture). The portion of the conductive trace that wraps around the metal-plated via/aperture may be maintained at a generally constant distance from the metal-plated via/aperture in some embodiments, although it will be appreciated that some variation in distance may be provided while still obtaining the benefits of the annular ring-to-via capacitors according to embodiments of the present invention that are discussed below. In some embodiments, the conductive trace may wrap around at least one-quarter, one-third, one-half, two-thirds or three-quarters of the way around the metal-plated via/aperture. Note that while the term "annular" is often used to refer to structures that extend for 360 degrees (i.e., in a full circle), in the present application the term "annular" is used to encompass structures that extend for less than a full circle, as described above.

The annular ring-to-via capacitors according to embodiments of the present invention may have several advantages over other conventional printed circuit board capacitors such as interdigitated finger capacitors or plate capacitors. First, the annular ring-to-via capacitors may be less sensitive to mechanical variations in mass-produced printed circuit boards such as small variations in layer alignments, variations in the etching of conductive layers to form the conductive traces, and/or in layer thicknesses. Thus, the annular ring-to-via capacitors according to embodiments of the present invention may have more consistent capacitance values, which may result in enhanced crosstalk cancellation. Second, as the annular ring-to-via capacitors use pre-existing metal-plated vias/apertures for one of the electrodes thereof, they require less space to implement on the printed circuit board. As there is often limited space available on the printed circuit board, particularly in the front and middle portions of the printed circuit board, this savings in space may be significant, and may allow the use of printed circuit boards having fewer layers, which are less expensive. Third, the annular ring-to-via capacitors may generate more capacitance per unit surface area of conductive trace than interdigitated finger capacitors due to the vertical nature of the metal-plated via/aperture.

Figure 13:
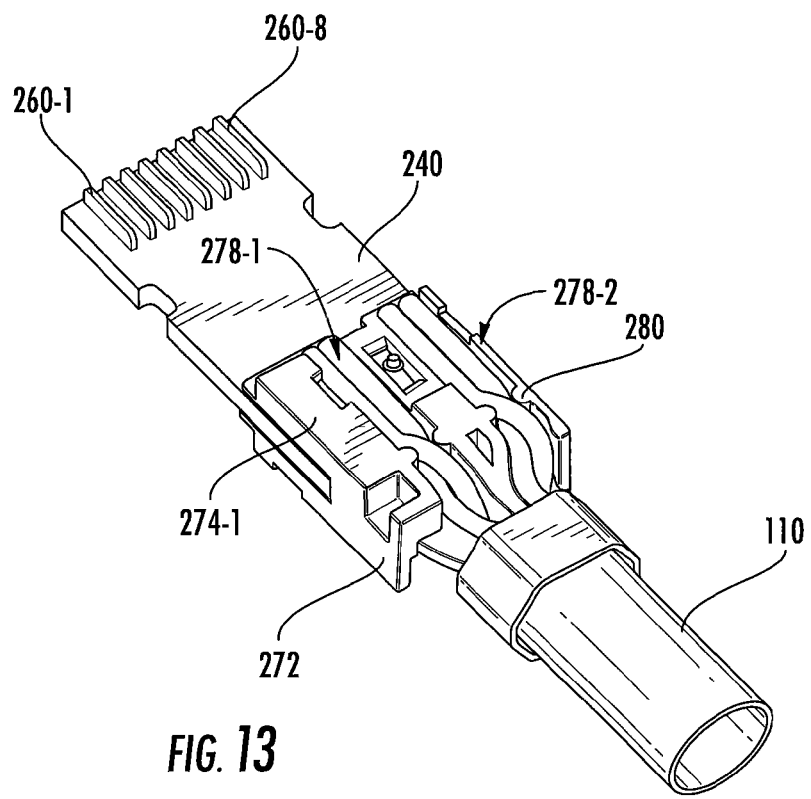
FIG. 13 is a top-rear perspective view of the printed circuit board and wire guide of the plug of FIG. 4.
Figure 14:
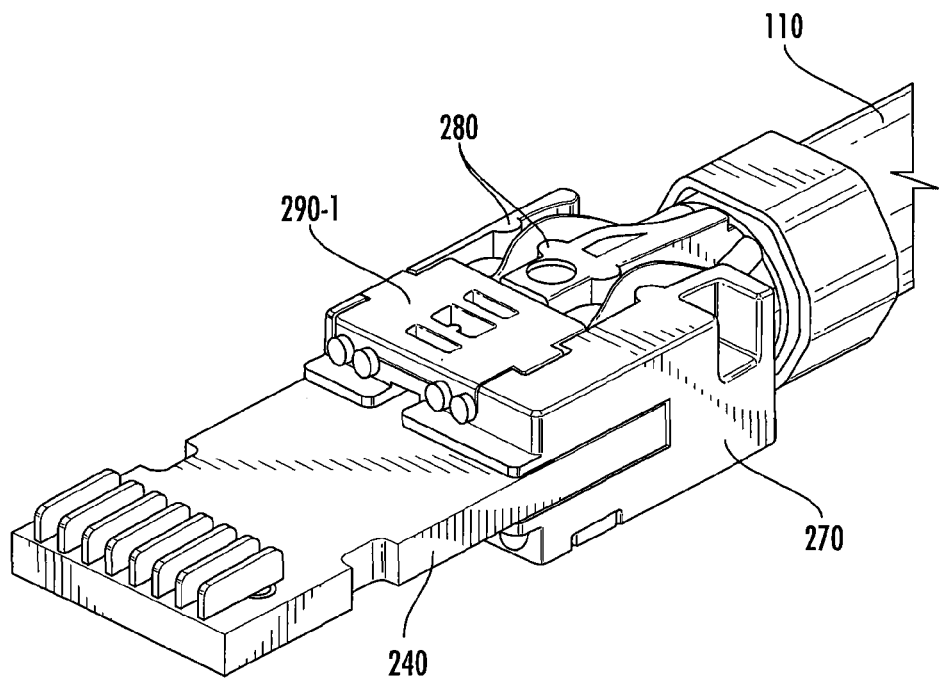
FIG. 14 is a top-front perspective view of the printed circuit board and wire guide of the plug of FIG. 4.
Figure 15:
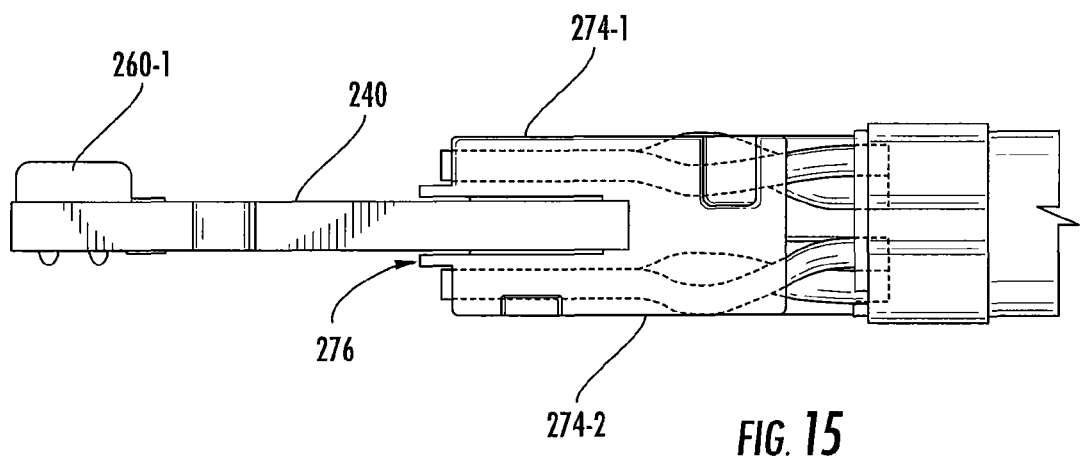
FIG. 15 is a side view of the printed circuit board and wire guide of the plug of FIG. 4.

FIGS. 13-17 illustrate the wire guide 270 of plug 200 in greater detail. In particular, FIGS. 13-15 are a top-rear perspective view, a top-front perspective view and a side view of the wire guide 270 that illustrate how it mates with the printed circuit board 240. FIGS. 16A and 16B are top-front perspective views of the two different wire guides 270, 270' that may be included in the respective plugs 200, 200' of patch cord 100. Finally, FIG. 17 is an enlarged top view of a back portion of the wire guide 270.

Referring to FIGS. 13-17, the wire guide 270 receives the eight insulated conductors 130-1 through 130-8 of the communications cable 110 and routes the insulated conductors 130 into appropriate positions for termination onto the insulation piercing contacts 262-1 through 262-8 that are mounted on the top and bottom surfaces of the printed circuit board 240. The wire guide 270 includes various features that facilitate reducing the amount of crosstalk that arises between the differential pairs 140 of insulated conductors as they exit the cable jacket 120 and come out of the cable core twist that is maintained within the cable jacket 120.

As shown in FIGS. 13-17, the wire guide 270 includes upper and lower shelves 274-1, 274-2 that extend forwardly from a main body 272. A crosstail 282 extends rearwardly from the main body 272. Referring to FIGS. 13-15, the rear of the printed circuit board 240 is slid in between the upper and lower shelves 274-1, 274-2 before the insulation piercing contacts 262 are mounted onto the printed circuit board 240. In other embodiments, the insulation piercing contacts 262 may be mounted into the printed circuit board 240 first and then the wire guide 270 may ride over them and snap into place when the printed circuit board 240 with the insulation piercing contacts 262 thereon is slid between the shelves 274 of the wire guide 270. Longitudinal channels 278-1 and 278-2 are provided in the upper shelf 274-1, and these channels 278-1, 278-2 also extend through the main body 272. Another pair of longitudinal channels 278 are provided in the lower shelf 274-2 (the channels 278 in the lower shelf 274-2 are only partially visible in the figures), and these channels 278 likewise also extend through the main body 272. Openings (see FIG. 19) are provided in the bottom of each channel 278. These openings are aligned over (or under) a pair of metal-plated apertures 248 that receive the insulation piercing contacts 262, thereby allowing the insulation piercing contacts 262 to be mounted into the printed circuit board 240 after the printed circuit board 240 has been mounted within the shelves 274. The insulation piercing contacts 262, once mounted in the printed circuit board 240, may engage walls of the openings in order to hold the printed circuit 240 in place between the shelves 274.

Each differential pair 140 of insulated conductors 130 is received within a respective one of the channels 278. This serves to route the insulated conductors 130 to be above or below the corresponding insulation piercing contact 262 that each insulated conductor 130 is terminated into. As shown in FIGS. 13, 16A, 16B and 17, the four differential pairs 140 of insulated conductors 130 extend side-by-side in the longitudinal direction in their respective channels 278. Each channel 278 also includes a respective twist termination structure 280 in the form of a pair of inwardly projecting stops 280 that narrow the respective channels 278 to a width that is approximately the width of one of the insulated conductors 130. Because of the stops 280, each differential pair 140 of insulated conductors 130 must be aligned vertically to pass between the stops 280. Once passing between the stops 280, each differential pair 140 of insulated conductors 130 undergoes an additional quarter twist and then are maintained in a side-by-side configuration. The stops 280 thus ensure that the insulated conductors 130 are maintained in consistent positions so that crosstalk that is generated between the differential pairs 140 may be reduced, and so that the crosstalk that does arise may be more consistently cancelled by the above-described crosstalk compensation circuits included on printed circuit board 240.

As can be seen, for example, in FIGS. 9 and 13-15, the insulated conductors 130 terminate onto both the top and bottom sides of the printed circuit board 240, with two differential pairs 140 of insulated conductors 130 terminating into the top side of printed circuit board 240 and the other two differential pairs 140 of insulated conductors 130 terminating into the bottom side of the printed circuit board 240. This allows the conductors 130 of different differential pairs 140 to be spaced apart a greater distance along the transverse dimension, and provides additional separation in the vertical dimension, both of which reduce crosstalk between the differential pairs 140, and also facilitates maintaining the twist in the differential pairs 140 of conductors 130 up to almost the points of termination (which further helps mitigate crosstalk). This arrangement also allows greater separation between the conductive traces that form the conductive paths 250 on the printed circuit board 240 in order to reduce or minimize coupling.

Additionally, the wire guide 270 is designed so that the center-point of the cable 110 along the vertical axis will be aligned with the center-point of the printed circuit board 240 along the vertical axis. This approach may reduce variation between the amount of crosstalk arising in the wire guide 270 used in the plug 200 and in the wire guide 270' used in the plug 200'.

Another feature of the plug 200 is that the positions of the "tip" and "ring" conductors 130 vary between differential pairs 140 at the locations where the conductors 130 terminate into the printed circuit board 240 in order to reduce crosstalk. In particular, as shown in FIG. 9, for differential pairs 140-2 and 140-4, the "tip" insulated conductor 130 (i.e., insulated conductors 130-1 and 130-7) is to the left of the ring insulated conductor 130 (i.e., insulated conductors 130-2 and 130-8). In contrast, for differential pairs 140-1 and 140-3, the "tip" insulated conductor 130-1 and 130-3 are to the right of the ring insulated conductors 130-4 and 130-6. This arrangement facilitates routing conductive path 250-3 through 250-6 so that conductive path 250-3 couples with conductive path 250-5 and conductive path 250-4 couples with conductive path 250-6 in the center of the printed circuit board 240, which, as discussed above, generates compensating crosstalk. This arrangement also facilitates the crossover of conductive paths 250-3 and 250-6 in the center region of the printed circuit board 240 which improve differential-to-common mode crosstalk performance for pairs 252-2 and 252-3 and for pairs 252-3 and 252-4.

The crosstail 282 includes a vertical member 284-1 and a horizontal member 284-2. The crosstail 282 is inserted within the jacket 120 of the communications cable 110 and separates the four differential pairs 140 of insulated conductors 130 from each other in the end portion of the cable 110. The crosstail 282 may provide structural members that the strain relief ring 298 may crimp against in order to provide strain relief so that the cable jacket 120 cannot easily be pulled out of the plug housing 210. The horizontal member 284-2 includes a pair of slots 286. Recesses other than slots may also be used. The separator tape 150 in cable 110 may be routed into one of the slots 286 when the crosstail 282 is inserted into the cable 110, and thus the separator tape 150 need not be shortened more than the cable jacket 120, forced into one of the four quadrants of the crosstail 282, or forced to collapse onto itself back into the cable 110. Since the separator tape 150 is not forced into an abnormal position, any disturbance that it may have on the positions of the insulated conductors 130 is reduced. This may reduce crosstalk between the differential pairs 140 and may ensure that the crosstalk that is generated is within a consistently tight range across different plugs having the design of plug 200 so that the crosstalk may be compensated for via the crosstalk compensation structures on the printed circuit board 240. It will be appreciated that the crosstail 282 may be rotated in other embodiments (e.g., rotated 45 degrees). While the crosstail 282 and main body 272 of wire guide 270 are formed as a single unit, it will be appreciated that the main body 272 and crosstail 282 may be separate pieces in other embodiments that together form the wire guide 270.

Figure 21A:
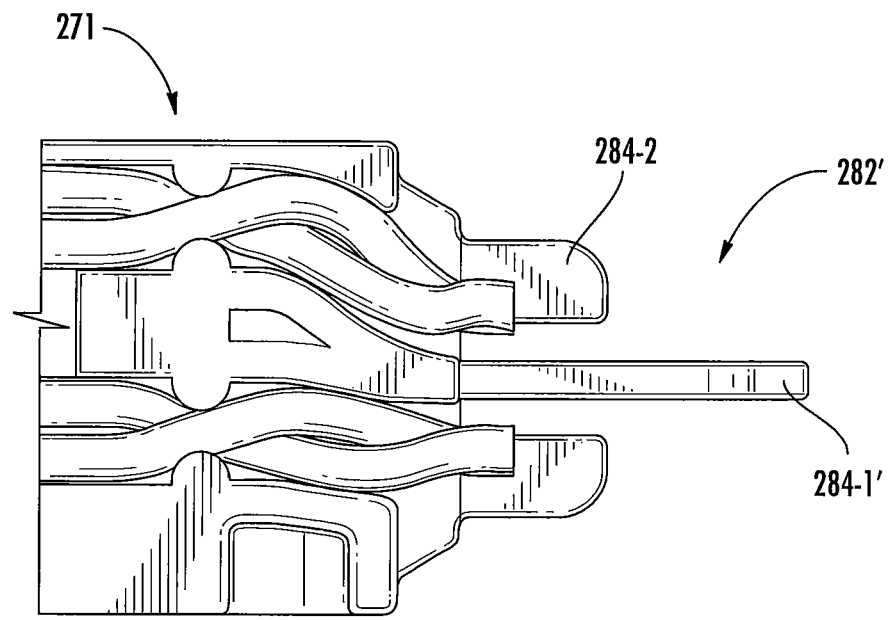
FIGS. 21A and 21B are a top view and side view, respectively, of a wire guide according to further embodiments of the present invention.
Figure 21B:
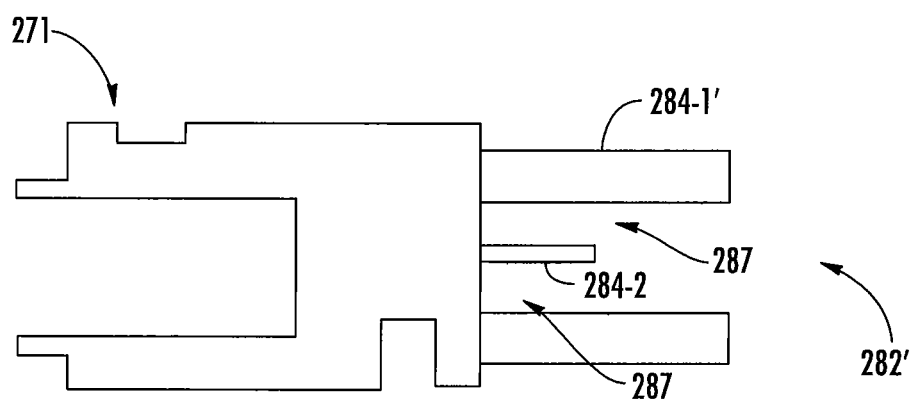
Figure 21C:
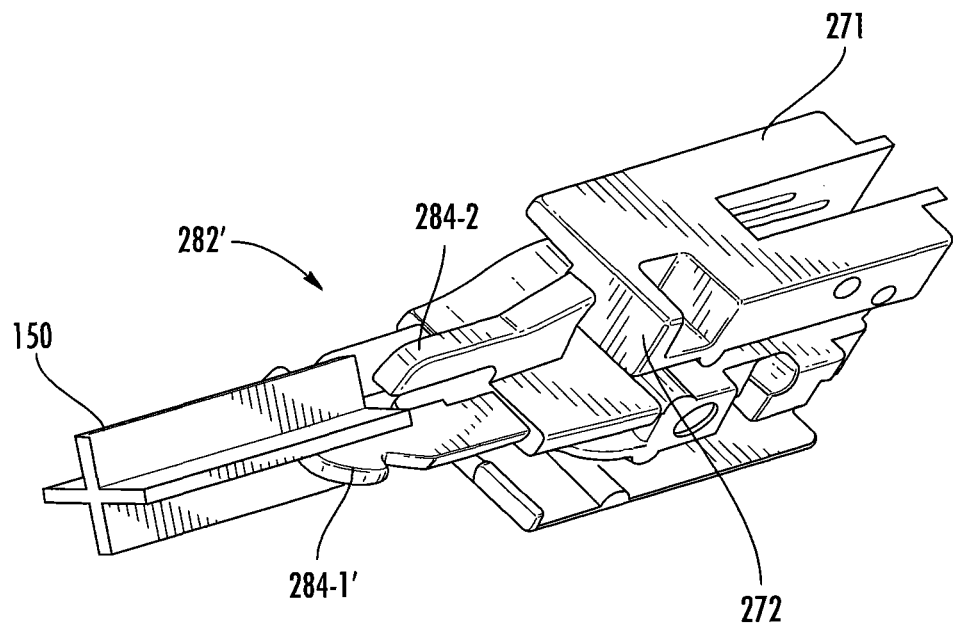
FIGS. 21C and 21D are a perspective view and back view, respectively, illustrating how a flute separator may fit within slots of the wire guide of FIGS. 21A-B.
Figure 21D:
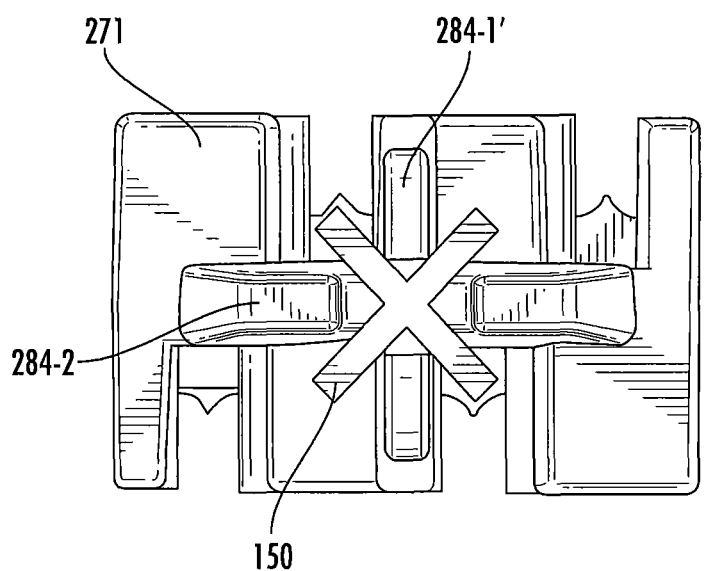

FIGS. 21A through 21D illustrate a wire guide 271 according to further embodiments of the present invention that may work well with communications cables having flute style separators 150 (also referred to sometimes as cruciform separators). In particular, FIGS. 21A and 21B are a top view and a side view of the wire guide 271, while FIGS. 21C and 21D are a perspective view and back view, respectively, illustrating how the flute separator 150 may fit within slots of the wire guide 271.

As shown in FIGS. 21A and 21B, wire guide 271 includes a crosstail 282' that has a pair of slots 287 in the vertical member 284-1, such that the crosstail 282' includes a total of four slots 286, 287. Such a design may be advantageous when cables 110 are used that include a flute separator 150, as the crosstail 282' has a slot 286, 287 for each projection of the flute separator 150, allowing the flute separator 150 to extend all the way to the main body 272 of the wire guide 282'.

The wire guide 270 may also reduce crosstalk because the distance between the location where the cable jacket 120 ends to the twist termination structures 280 may be very short. For example, in plugs according to embodiments of the present invention, this distance may be less than 5.3 millimeters for each of the four differential pairs 140. In a conventional plug, this distance may be almost twice this long, and can be a significant source of crosstalk and, worse yet, it may be crosstalk that has a relatively large delay and a relatively high degree of variability across different plugs, which thus cannot be consistently compensated for. The distance between the twist termination structures 280 and the ends of each insulated conductor 130 may also be very short (e.g., less than 8.5 millimeters). This distance, however, may be less critical, as the amount of crosstalk that arises between differential pairs 140 in this region typically has more consistently constant values and hence can be mostly cancelled via crosstalk compensation structures located elsewhere in the plug.

In some embodiments, the crosstail 282 may be plated with a conductive material in order to enhance its shielding properties.

The plug 200 may also include various features that are designed to reduce return loss. For example, as shown in FIG. 11, the printed circuit board 240 includes a plurality of holes 292 that are drilled vertically therethrough that are not plated with metal. These holes 292 are used to adjust the impedance of differential pairs 252-1 and 252-3. It will be appreciated that fewer or more holes 292 may be included (and that the size of the holes may be varied) depending upon the amount of adjustment needed. In particular, air has a lower dielectric constant than typical printed circuit board dielectric materials, and hence by including air gaps in between the conductive traces of differential pairs 252-1 and 252-3, the impedance of the differential pair may be changed to be closer to a desired level (i.e., 100 ohms). As another example, the two conductive traces 250 that form each of the differential pairs 252 are generally run together, side-by-side, on the printed circuit board 240, which may provide improved impedance matching, and hence reduced return loss.

Figure 18A:
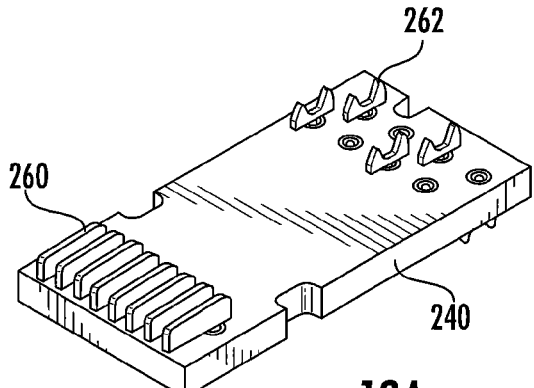
FIGS. 18A-18D are top and bottom views of the printed circuit boards of the two plugs that are included on the patch cord of FIG. 3.
Figure 18B:
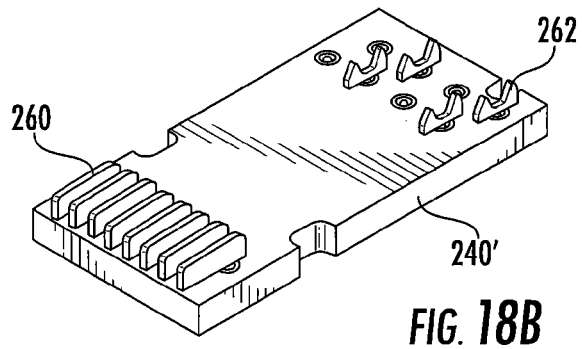
Figure 18C:
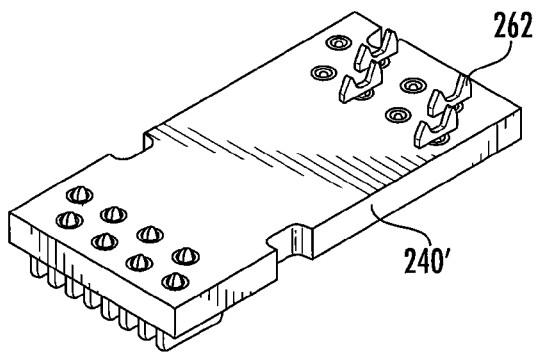
Figure 18D:
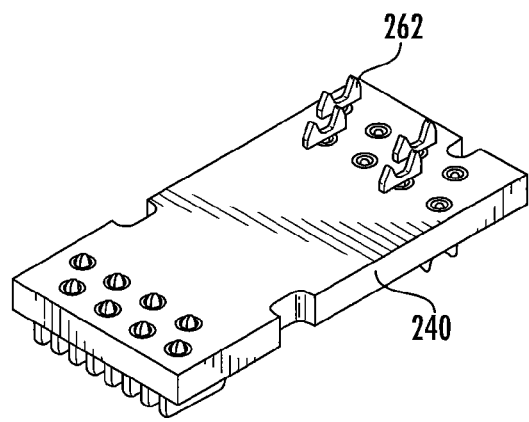

FIGS. 18A-18D are top and bottom views of the printed circuit boards of the two plugs that are included on the patch cord of FIG. 3. In particular, FIGS. 18A and 18D illustrate the plug blade 260 and insulation piercing contact 262 arrangement for the top and bottom surfaces, respectively, of the printed circuit board 240 included in the plug 200, while FIGS. 18B and 18C illustrate the plug blade 260 and insulation piercing contact 262 arrangement for the top and bottom surfaces, respectively, of a printed circuit board 240' that is included in the plug 200'. As can readily be seen in FIGS. 18A-18D, the arrangement in each plug 200, 200' maximizes the spacing between the differential pairs in order to reduce crosstalk.

Figure 19:
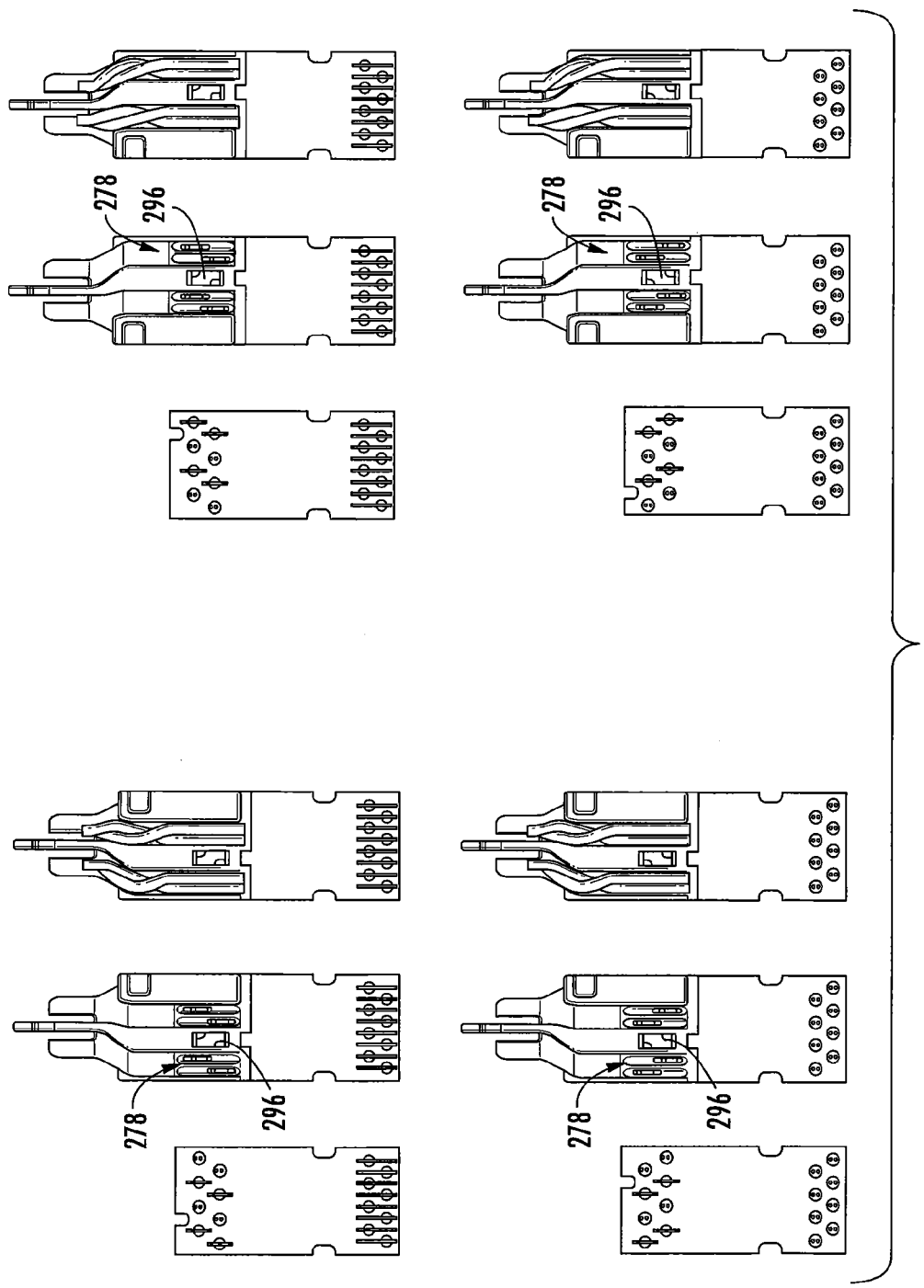
FIG. 19 is a series of three views of the top and bottom surfaces of the printed circuit boards of FIGS. 18A-18D.

FIG. 19 is a series of three views of the top and bottom surfaces of the printed circuit boards of FIGS. 18A-18D, illustrating how each printed circuit board fits within its respective wire guide and how the conductors of a communications cable are terminated into the printed circuit board using the wire guide. The channels 278 in the wire guides 270, 270' can clearly be seen in FIG. 19. Additionally, each shelf 274-1, 274-2 of the wire guides 270, 270' includes an air gap 296 between the differential pairs 140 of insulated conductors 130 that are terminated into the wire guide 270, 270'. These air gaps 296 serve as recesses for the top and bottom wire covers 290-1, 290-2 to latch into, and may be omitted in other embodiments.

The plugs (and patch cords that include such plugs) according to embodiments of the present invention may exhibit outstanding crosstalk performance. As described above, in some embodiments, the plugs may include relatively low profile plug blades that have shorter signal current carrying paths through the plug blades. Offending crosstalk capacitors may be provided in the printed circuit board at locations that are very close to the plug-jack mating point so that a greater proportion of the offending crosstalk is injected very close to the plug-jack mating point. This may allow for more effective cancellation of such crosstalk in a mating jack.

As another example, the plug 200 may include press-fit plug blades 260 and/or press-fit insulation piercing contacts 262. The use of such press-fit structures eliminate the need to hand solder structures to the printed circuit board 240, and hence reduce manufacturing costs. Two different wire guides 270, 270' are provided so that crosstalk between the portions of the insulated conductors 130 that are terminated into the plugs 200, 200' may be reduced or minimized. The wire guides 270, 270' may reduce crosstalk and/or more tightly control the amount of crosstalk generated in several ways including (1) allowing the cable jacket to remain on the cable 110 all the way to the back end of the wire termination structure 270 (thereby maintaining the core twist in the cable 110 for a greater distance), (2) providing the slots 286 for the separator tape 150 which reduces and more tightly controls the crosstalk, (3) providing twist termination structures 280 for consistently transitioning the conductors 130 of each differential pair 140 from a twisted configuration to a side-by-side configuration at the same locations, (4) decreasing the distance between the cable jacket 120 and the twist termination structures 280, and (5) maintaining a large separation between the differential pairs 140 within the confines of the plug housing.

The printed circuit board 240 likewise includes a number of crosstalk reduction structures including (1) annular ring-to-via crosstalk capacitors 259-1 through 259-6 that may exhibit more consistent capacitance values and which may use less space on the printed circuit board 240, (2) a pair three crossover on the printed circuit board 240 that reduces pair 3 to pair 2 and pair 3 to pair 4 differential-to-common mode crosstalk and that also allows for tuning of the pair 1 to pair 3 differential-to-differential crosstalk magnitude and phase, (3) conductive image planes 256 for reducing crosstalk between conductive traces 250 on different layers 242 of the printed circuit board 240 and (4) capacitors between the metal-plated apertures for plug blades 260-1 and 260-6 and for plug blades 260-3 and 260-8 that inject offending differential-to-differential crosstalk between pairs 2 and 3 and between pairs 3 and 4, respectively, while also injecting compensating differential-to-common mode crosstalk between pairs 2 and 3 and between pairs 3 and 4, respectively. Additionally, the use of a printed circuit board provides more consistent coupling than plugs in which the insulated conductors of the communications cable are terminated directly into the plug blades, which may further improve both the differential-to-differential and differential-to-common mode crosstalk performance of the plugs according to embodiments of the present invention, and may also allow for better tuning of return loss performance.

The present invention is not limited to the illustrated embodiments discussed above; rather, these embodiments are intended to fully and completely disclose the invention to those skilled in this art. In the drawings, like numbers refer to like elements throughout. Thicknesses and dimensions of some components may be exaggerated for clarity.

Spatially relative terms, such as "top," "bottom," "side," "upper," "lower" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Herein, the term "signal current carrying path" is used to refer to a current carrying path on which an information signal will travel on its way from the input to the output of a communications plug. Signal current carrying paths may be formed by cascading one or more conductive traces on a wiring board, metal-filled apertures that physically and electrically connect conductive traces on different layers of a printed circuit board, portions of plug blades, conductive pads, and/or various other electrically conductive components over which an information signal may be transmitted. Branches that extend from a signal current carrying path and then dead end such as, for example, a branch from the signal current carrying path that forms one of the electrodes of an inter-digitated finger or plate capacitor, are not considered part of the signal current carrying path, even though these branches are electrically connected to the signal current carrying path. While a small amount of current will flow into such dead end branches, the current that flows into these dead end branches generally does not flow to the output of the plug that corresponds to the input of the plug that receives the input information signal.

Well-known functions or constructions may not be described in detail for brevity and/or clarity. As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, integers, steps, operations, elements, and/or components, but do not preclude the presence or addition of one or more other features, integers, steps, operations, elements, components, and/or groups thereof.

All of the above-described embodiments may be combined in any way to provide a plurality of additional embodiments.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and That which is claimed is:

1. A patch cord comprising:
   a communications cable that includes a first conductor and a second conductor that are twisted together to form a second differential pair of conductors, a third conductor and a sixth conductor that are twisted together to form a third differential pair of conductors, a fourth conductor and a fifth conductor that are twisted together to form a first differential pair of conductors, and a seventh conductor and an eighth conductor that are twisted together to form a fourth differential pair of conductors; and
   a plug that is attached to the communications cable, the plug comprising:
      a housing that receives the communications cable;
      a printed circuit board that is at least partly within the housing;
      a first plug contact that is electrically connected to the first conductor via a first conductive path on the printed circuit board, a second plug contact that is electrically connected to the second conductor via a second conductive path on the printed circuit board, a third plug contact that is electrically connected to the third conductor via a third conductive path on the printed circuit board, a fourth plug contact that is electrically connected to the fourth conductor via a fourth conductive path on the printed circuit board, a fifth plug contact that is electrically connected to the fifth conductor via a fifth conductive path on the printed circuit board, a sixth plug contact that is electrically connected to the sixth conductor via a sixth conductive path on the printed circuit board, a seventh plug contact that is electrically connected to the seventh conductor via a seventh conductive path on the printed circuit board, and an eighth plug contact that is electrically connected to the eighth conductor via an eighth conductive path on the printed circuit board, where the first through eighth plug contacts are arranged in a row in numerical order;
      first through eighth wire termination contacts that receive the respective first through eighth conductors, the first through eighth wire termination contacts mounted in respective first through eighth metal-plated vias in the printed circuit board;
      a wire guide that has a top shelf that extends above a top surface of the printed circuit board and a bottom shelf that extends below a bottom surface of the printed circuit board,
      wherein two of the first through fourth differential pairs of conductors are routed into respective first and second channels in the top shelf of the wire guide and the other two of the first through fourth differential pairs of conductors are routed into respective third and fourth channels in the bottom shelf of the wire guide,
      wherein the printed circuit board has a front edge, a rear edge and left and right side edges that each extend between the front edge and the rear edge,
      wherein the third and fifth metal-plated vias are mounted in a first transverse row that extends between the left side and the right side of the printed circuit board, and the fourth and sixth metal-plated vias are mounted in a second transverse row that extends between the left side and the right side of the printed circuit board, and
      wherein the third and fourth metal-plated vias are closer than the fifth and sixth metal plated vias to an axis that extends from the front edge to the rear edge of the printed circuit board halfway between the left and right side edges.

2. The patch cord of claim 1, wherein the first differential pair of conductors is routed into one of the first through fourth channels that is on one of the top shelf or the bottom shelf and the third differential pair of conductors is routed into one of the first through fourth channels that is on the other of the top shelf or the bottom shelf.

3. The patch cord of claim 1, wherein the row in which the first through eight plug contacts are arranged extends from the left side of the printed circuit board to the right side of the printed circuit board, wherein the third wire termination contact is mounted to the right of the sixth wire termination contact and the fourth wire termination contact is mounted to the left of the fifth wire termination contact.

4. The patch cord of claim 1, wherein the communications cable has a first height above a first plane defined by the top surface of the printed circuit board and the communications cable has a second height below a second plane defined by the bottom surface of the printed circuit board, where the first height is substantially equal to the second height.

5. The patch cord of claim 1, wherein a twist terminator is provided in at least one of the first through fourth channels.

6. The patch cord of claim 5, wherein the communications cable further includes a jacket that surrounds the first through eighth conductors, and wherein for all possible variations of twist positions for the conductors of the first through fourth differential pairs of conductors from the point where the conductors exit a jacket of the communications cable to the point where the conductors of each of the first through fourth differential pairs pass through the vertical center of the respective twist terminator included in the respective one of the first through fourth channels that receive the respective first through fourth differential pairs, the near-end crosstalk variation between the third differential pair and each of the first, second and fourth differential pairs is less than respective predetermined values.

7. The patch cord of claim 1, wherein the wire guide includes a crosstail which includes at least one recess that is configured to receive a separator of the communications cable.

8. The patch cord of claim 1, wherein a first air gap is provided between the first and second channels in the top shelf of the wire guide and a second air gap is provided between the third and fourth channels in the bottom shelf of the wire guide.

9. A patch cord comprising:
   a communications cable that includes a first conductor and a second conductor that are twisted together to form a second differential pair of conductors, a third conductor and a sixth conductor that are twisted together to form a third differential pair of conductors, a fourth conductor and a fifth conductor that are twisted together to form a first differential pair of conductors, and a seventh conductor and an eighth conductor that are twisted together to form a fourth differential pair of conductors; and
   a plug that is attached to the communications cable, the plug comprising:

a housing that receives the communications cable;

a printed circuit board mounted at least partly within the housing; and first through eighth wire termination contacts mounted in the printed circuit board that receive the respective first through eighth conductors, wherein the third wire termination contact is mounted directly next to and to the right of the sixth wire termination contact, wherein the fourth wire termination contact is mounted directly next to and to the left of the fifth wire termination contact, and wherein the third and sixth wire termination contacts are mounted to extend in a first direction that is perpendicular to a top surface of the printed circuit board and the fourth and fifth wire termination contacts are mounted to extend in a second direction that is perpendicular to the top surface of the printed circuit board, the second direction being opposite the first direction.

10. The patch cord of claim 9, wherein the first direction is an upward direction and the second direction is a downward direction so that the third and sixth wire termination contacts extend upwardly from the top surface of the printed circuit board and the fourth and fifth wire termination contacts extend downwardly from a bottom surface of the printed circuit board.

11. The patch cord of claim 9, wherein the first direction is a downward direction and the second direction is an upward direction so that the third and sixth wire termination contacts extend downwardly from a bottom surface of the printed circuit board and the fourth and fifth wire termination contacts extend upwardly from the top surface of the printed circuit board.

12. The patch cord of claim 9, wherein the printed circuit board has a front edge, a rear edge and left and right side edges that each extend between the front edge and the rear edge, wherein the first through eight wire termination contacts are mounted in respective first through eighth metal-plated vias in the printed circuit board, and wherein the third and fifth metal-plated vias are mounted in a first transverse row that extends between the left side and the right side of the printed circuit board, and the fourth and sixth metal-plated vias are mounted in a second transverse row that extends between the left side and the right side of the printed circuit board.

13. The patch cord of claim 9, wherein the plug further includes a wire guide that has a first shelf that extends along a first face of the printed circuit board and second shelf that extends along a second face of the printed circuit board, and wherein first and second differential pairs of conductors are routed into respective first and second channels in the first shelf of the wire guide and the third and fourth differential pairs of conductors are routed into respective third and fourth channels in the second shelf of the wire guide.

14. The patch cord of claim 13, wherein the first shelf is a top shelf that extends above a top surface of the printed circuit board and the second shelf is a bottom shelf that extends below a bottom surface of the printed circuit board.

15. The patch cord of claim 13, wherein the first shelf is a bottom shelf that extends below a bottom surface of the printed circuit board and the second shelf is a top shelf that extends above a top surface of the printed circuit board.

16. The patch cord of claim 13, wherein a twist terminator is provided in at least one of the first through fourth channels.

17. The patch cord of claim 13, wherein the wire guide includes a crosstail which includes at least one recess that is configured to receive a separator of the communications cable.

18. The patch cord of claim 9, wherein the communications cable has a first height above a first plane defined by the top surface of the printed circuit board and the communications cable has a second height below a second plane defined by a bottom surface of the printed circuit board, where the first height is substantially equal to the second height.

* * * * *